United States Patent
Inoue

(10) Patent No.: US 12,328,960 B2
(45) Date of Patent: Jun. 10, 2025

(54) PHOTOSENSOR AND DISTANCE MEASUREMENT SYSTEM

(71) Applicant: Panasonic Intellectual Property Management Co., Ltd., Osaka (JP)

(72) Inventor: Akito Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 465 days.

(21) Appl. No.: 17/792,912

(22) PCT Filed: Jan. 18, 2021

(86) PCT No.: PCT/JP2021/001525
§ 371 (c)(1),
(2) Date: Jul. 14, 2022

(87) PCT Pub. No.: WO2021/149650
PCT Pub. Date: Jul. 29, 2021

(65) Prior Publication Data
US 2023/0063377 A1     Mar. 2, 2023

(30) Foreign Application Priority Data
Jan. 21, 2020  (JP) ................................ 2020-007247

(51) Int. Cl.
*H10F 39/00*   (2025.01)
*H10F 39/12*   (2025.01)

(52) U.S. Cl.
CPC ....... *H10F 39/8027* (2025.01); *H10F 39/199* (2025.01)

(58) Field of Classification Search
CPC ........... H01L 27/14607; H01L 27/1464; H01L 31/107; H10F 39/8027
See application file for complete search history.

(56) References Cited

U.S. PATENT DOCUMENTS 8,773,562 B1 * 7/2014 Fan ................. H04N 25/77 348/308
10,504,953 B2 * 12/2019 Yanagita ........... H01L 27/14641
(Continued)

FOREIGN PATENT DOCUMENTS

CN     105009291 A     10/2015
CN     107665897 A     2/2018
(Continued)

OTHER PUBLICATIONS

International Search Report issued on Mar. 23, 2021 in corresponding International Patent Application No. PCT/JP2021/001525, with English translation.
(Continued)

*Primary Examiner* — Douglas M Menz
(74) *Attorney, Agent, or Firm* — Rimon P.C.

(57) ABSTRACT

A photosensor includes: APD regions and a dividing region located between adjacent APD regions. The first semiconductor substrate includes a first primary surface and a second primary surface. An APD in each APD region includes: a first semiconductor layer of a first conductivity type that is in contact with the first primary surface; and a second semiconductor layer of a second conductivity type opposite to the first conductivity type which is closer to the second primary surface than the first semiconductor layer is. The dividing region includes: a third semiconductor layer and a trench closer to the second primary surface than the third semiconductor layer is. The trench includes a first end in contact with the second primary surface and a second end apart from the first primary surface. A part of the trench between the second end and the first primary surface is at least partially depleted.

17 Claims, 23 Drawing Sheets

(56) References Cited

U.S. PATENT DOCUMENTS

| | | | |
|---|---|---|---|
| 2009/0256223 | A1 | 10/2009 | Yamamura et al. |
| 2018/0033896 | A1 | 2/2018 | Morimoto et al. |
| 2018/0197905 | A1 | 7/2018 | Sakata et al. |
| 2019/0157323 | A1 | 5/2019 | Ogi et al. |
| 2021/0143196 | A1* | 5/2021 | Uchida ............... H01L 27/1463 |
| 2022/0262970 | A1* | 8/2022 | Murakami ...... H01L 31/035272 |

FOREIGN PATENT DOCUMENTS

| | | |
|---|---|---|
| CN | 107949913 A | 4/2018 |
| JP | 2007-335596 A | 12/2007 |
| WO | 2008/004547 A | 1/2008 |
| WO | 2014/120447 A1 | 8/2014 |
| WO | 2016/174090 A1 | 9/2019 |

OTHER PUBLICATIONS

Chinese Search Report dated Mar. 28, 2025 issued in the corresponding Chinese Patent Application No. 202180009299.5, with English translation.

* cited by examiner

PHOTOSENSOR AND DISTANCE MEASUREMENT SYSTEM

CROSS-REFERENCE TO RELATED APPLICATIONS

This application is the U.S. National Phase under 35 U.S.C. § 371 of International Patent Application No. PCT/JP2021/001525, filed on Jan. 18, 2021, which in turn claims the benefit of Japanese Patent Application No. 2020-007247, filed on Jan. 21, 2020, the entire content of each of which is incorporated herein by reference.

TECHNICAL FIELD

The present disclosure relates to a photosensor and a distance measurement system.

BACKGROUND ART

In recent years, high-sensitivity photosensors (light detectors) are utilized in the fields of communication, in-vehicle use, monitoring, chemistry, biology, medicine, radiation detection, and the like. An avalanche photo diode (hereinafter, also referred to as an APD) is used as one of measures for sensitivity improvement. The APD is a photo diode that multiplies, using avalanche breakdown, signal electric charge generated by photoelectrically converting incident light that has entered a photoelectric conversion layer, to thereby improve the detection sensitivity of the incident light. The use of the APD makes it possible to improve the detection sensitivity even if the number of photons is very small.

For example, Patent Literature (PTL) 1 given below discloses a photosensor including: a plurality of APDs arranged in an array form; and a trench arranged between adjacent APDs among the plurality of APDs. As in this photosensor, the adjacent APDs are divided by the trench, whereby color mixing between the APDs can be reduced.

CITATION LIST

Patent Literature

[PTL 1] International Publication No. WO 2018/174090

SUMMARY OF INVENTION

Technical Problem

However, in the case where the adjacent APDs are divided by the trench as in PTL 1, in order to inactivate defects on a trench surface, it is necessary to provide a protection layer (for example, an inactivation layer) for preventing depletion of the trench surface and a trench side surface, and, in order to prevent electric field concentration in the protection layer, it is necessary to provide an electric field relaxing layer. In this case, because the trench, the protection layer, and the electric field relaxing layer have no light sensitivity, the aperture ratio of the photosensor decreases, and sensitivity improvement of the photosensor is difficult.

The present disclosure has an object to achieve both sensitivity improvement of a photosensor and the like and prevention of color mixing by forming a trench without decreasing the aperture ratio of the photosensor.

Solution to Problem

In accordance with an aspect of the present disclosure, a photosensor includes: a plurality of avalanche photo diode (APD) regions of a first semiconductor substrate, the plurality of APD regions each including an APD; and a dividing region of the first semiconductor substrate, the dividing region being located between adjacent APD regions among the plurality of APD regions, wherein the first semiconductor substrate includes a first primary surface and a second primary surface which are opposite to each other, the APD in each of the plurality of APD regions includes: a first semiconductor layer of a first conductivity type that is in contact with the first primary surface; and a second semiconductor layer of a second conductivity type opposite to the first conductivity type, the second semiconductor layer being closer to the second primary surface than the first semiconductor layer is, the dividing region includes: a third semiconductor layer of the first conductivity type or the second conductivity type that is closer to the first primary surface than the second primary surface, and a trench that is closer to the second primary surface than the third semiconductor layer is, the trench includes a first end that is in contact with the second primary surface and a second end that is apart from the first primary surface, and a part of the trench between the second end and the first primary surface is at least partially depleted.

In accordance with another aspect of the present disclosure, a distance measurement system includes: a light receiver including the above-described photosensor; a light emitter that emits light towards an object to be measured; a controller that controls the light receiver and the light emitter; and a calculator that receives, from the light receiver, a signal corresponding to the light reflected on the object, and calculates a distance to the object based on the signal.

Advantageous Effects of Invention

According to the present disclosure, it is possible to achieve both sensitivity improvement of a photosensor and the like and prevention of color mixing.

DESCRIPTION OF EMBODIMENTS

Hereinafter, certain exemplary embodiments will be described in detail with reference to the accompanying Drawings. The following embodiments are specific examples of the present disclosure. The numerical values, shapes, materials, elements, arrangement and connection configuration of the elements, etc., described in the following embodiments are merely examples, and are not intended to limit the present disclosure. Among elements in the following embodiments, those not described in any one of the independent claims indicating the broadest concept of the present disclosure are described as optional elements.

It should be noted that the respective figures are schematic diagrams and are not necessarily precise illustrations. Additionally, components that are essentially the same share like reference signs in the figures. Accordingly, overlapping explanations thereof are omitted or simplified.

Note that, in the following embodiments, with reference to a semiconductor substrate, the side on which a first primary surface is provided is defined as "below" or a "front surface," and the side on which a second primary surface is provided is defined as "above" or a "back surface." Moreover, a "horizontal direction" represents the direction parallel to the first primary surface and the second primary surface, and a "depth direction" represents the direction perpendicular to the first primary surface and the second primary surface. Moreover, the terms "above" and "below" are used for not only the case where two constituent elements are arranged with an interval therebetween and another constituent element is interposed between the two constituent elements but also the case where two constituent elements are in contact with each other.

Moreover, in the following embodiments, a "plan view" represents viewing from above in the direction normal to a light receiving surface of a photoelectric conversion layer.

Moreover, in the following embodiments, an "impurity concentration" represents an effective impurity concentration, and, in the case where impurities of different conductivity types exist in the same region, the "impurity concentration" represents a difference between the impurities.

Embodiment 1

1-1. Configuration of Photosensor

A photosensor according to Embodiment 1 is described with reference to FIG. 1 to FIG. 2B.

Figure 1:
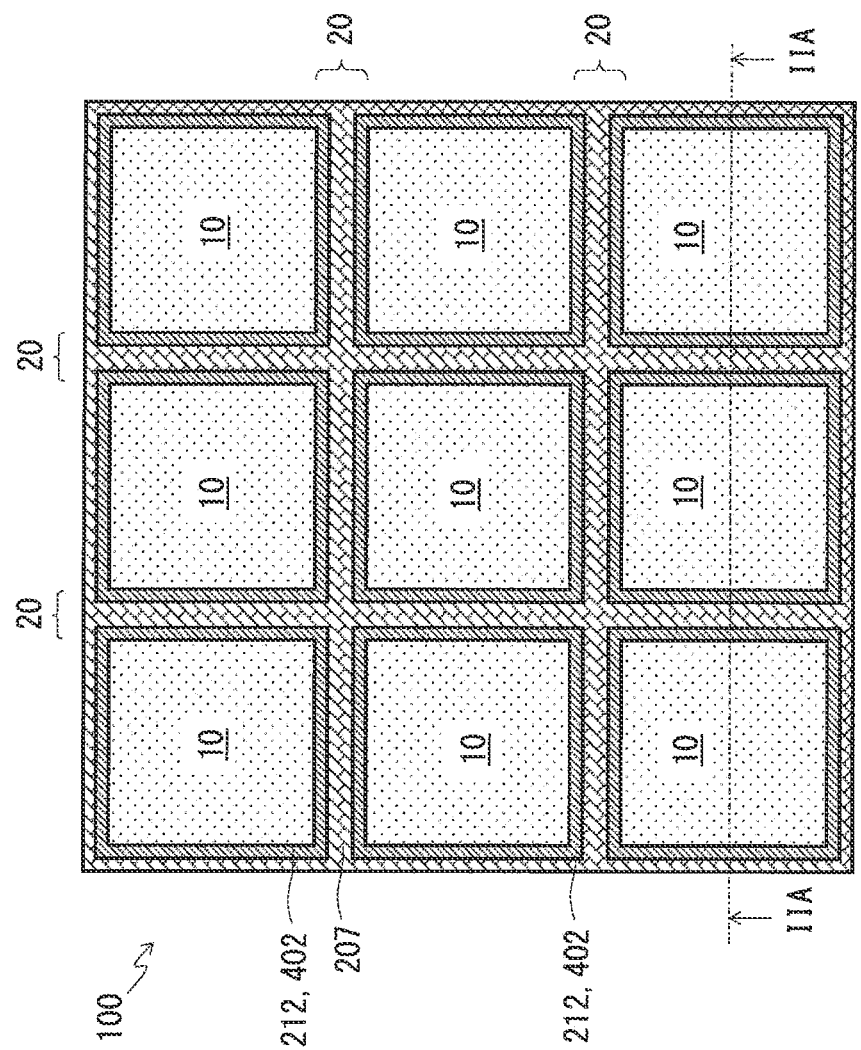
FIG. 1 is a plan view illustrating a partial layout configuration of a photosensor according to Embodiment 1.
Figure 2A:
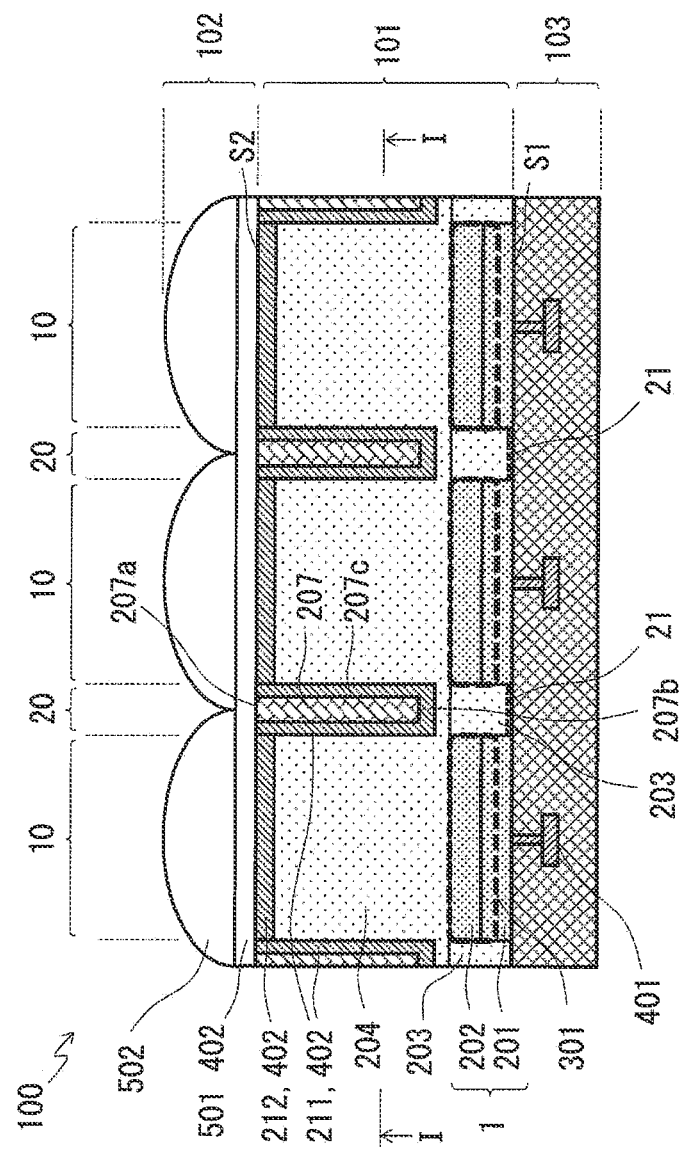
FIG. 2A is a cross-sectional view of the photosensor according to Embodiment 1, which is taken along an IIA-IIA line illustrated in FIG. 1.

FIG. 1 is a plan view illustrating a partial layout configuration of photosensor 100 according to Embodiment 1. FIG. 2A is a cross-sectional view of photosensor 100, which is taken along an IIA-IIA line illustrated in FIG. 1. Note that, FIG. 1 is a plan view of photosensor 100, which is taken along an I-I line illustrated in FIG. 2A.

Photosensor 100 includes a photo diode array in which a plurality of avalanche photo diodes (APDs) 1 are arranged in a matrix. Photosensor 100 includes a plurality of APD regions 10 each including APD 1, and APD regions 10 are electrically or physically divided from one another by grid-like dividing region 20. Dividing region 20 may have a portion that overlaps with APD regions 10. As described above, photosensor 100 includes: the plurality of APD regions 10 formed in the matrix; and dividing region 20 that is formed between adjacent APD regions 10 among the plurality of APD regions 10. Although not clearly specified herein, APD regions 10 may be formed in a zigzag pattern or a honeycomb pattern, and the shape of each APD 1 is not limited to a quadrangle and may be a polygon such as a triangle or a circle.

As illustrated in FIG. 2A, photosensor 100 includes first semiconductor substrate 101, optical layer 102 provided above first semiconductor substrate 101, and wiring layer 103 provided below first semiconductor substrate 101. APD regions 10 and dividing region 20 are formed in first semiconductor substrate 101.

Here, of two primary surfaces of first semiconductor substrate 101, a primary surface on wiring layer 103 side is defined as first primary surface S1, and a primary surface facing first primary surface S1, that is, a primary surface opposite to first primary surface S1 is defined as second primary surface S2.

First semiconductor layer 201 of a first conductivity type, second semiconductor layer 202 of a second conductivity type located on first semiconductor layer 201, and fourth semiconductor layer 204 of the second conductivity type are provided in first semiconductor substrate 101, and the second conductivity type is different in polarity from (opposite to) the first conductivity type. First semiconductor layer 201 is in contact with first primary surface S1, and second semiconductor layer 202 is closer to second primary surface S2 than first semiconductor layer 201 is. APD 1 includes above-mentioned first semiconductor layer 201 and above-mentioned second semiconductor layer 202. Fourth semiconductor layer 204 is formed in a whole area of first semiconductor substrate 101, is in contact with second semiconductor layer 202 in each APD region 10, and is closer to second primary surface S2 than second semiconductor layer 202 is.

For example, the first conductivity type is an N-type, and the second conductivity type is a P-type. However, the conductivity types may be opposite to the above, that is, the first conductivity type may be the P-type, and the second conductivity type may be the N-type.

Multiplying region 301 that performs avalanche multiplication to multiply electric charge generated by photoelectric conversion is formed in the vicinity of a boundary between first semiconductor layer 201 and second semiconductor layer 202.

Dividing region 20 includes: third semiconductor layer 203 that is different from first semiconductor layer 201 and second semiconductor layer 202; and trench 207 that is closer to second primary surface S2 than third semiconductor layer 203 is.

Trench 207 has a grid-like shape in a plan view. Moreover, trench 207 has a wall-plate-like shape in the cross-sectional view illustrated in FIG. 2A and is formed so as to extend in the top-bottom direction. Trench 207 extending in the top-bottom direction includes first end 207a that is in contact with second primary surface S2 and second end 207b that is apart from first primary surface S1. Specifically, trench 207 does not penetrate through dividing region 20 in the top-bottom direction, and second end 207b of trench 207 is closer to second primary surface S2 than the boundary between second semiconductor layer 202 and first semiconductor layer 201 is. A part of trench 207 between second end 207b and first primary surface S1 is at least partially depleted.

It is desirable that trench 207 be formed from a material that reflects incident light. In this case, the incident light can be suppressed from being photoelectrically converted in pixels other than a pixel that the incident light has entered, and color mixing between adjacent APDs 1 can be reduced. Consequently, the sensitivity of photosensor 100 can be improved.

Third semiconductor layer 203 is provided on the first primary surface S1 side of dividing region 20 in first semiconductor substrate 101. Third semiconductor layer 203 may be of the first conductivity type, and may be of the second conductivity type. Third semiconductor layer 203 is at least partially depleted around first primary surface S1, and adjacent APDs 1 are electrically divided by the depletion layer. No trench is formed on the first primary surface S1 side on which third semiconductor layer 203 is provided, and no contact is formed on first primary surface S1. Accordingly, dividing region area 21 corresponding to dividing region 20 in first primary surface S1 is apart from the trench and the contact.

Trench 207, first protection layer 211, and second protection layer 212 are provided on the second primary surface S2 side of dividing region 20 in first semiconductor substrate 101. First protection layer 211 is formed so as to surround trench 207, and second protection layer 212 is formed so as to be in contact with second primary surface S2.

First protection layer 211 is formed so as to cover side surface 207c and second end 207b of trench 207. Second protection layer 212 is arranged on fourth semiconductor layer 204 provided above second semiconductor layer 202, and is connected to first protection layer 211. First protection layer 211 and second protection layer 212 are closer to second primary surface S2 than second semiconductor layer 202 is. Second protection layer 212 is formed parallel to second semiconductor layer 202. The impurity concentration of fourth semiconductor layer 204 is lower than the impurity concentration of second semiconductor layer 202.

First contact 401 that is an electrode on the front surface side is provided in wiring layer 103. In this photosensor 100, a voltage is applied to first semiconductor layer 201 via first contact 401 from a first power supply (not illustrated), a voltage is applied to first protection layer 211 and second protection layer 212 via second contact 402 from a second power supply (not illustrated), and further a voltage is applied to second semiconductor layer 202 via fourth semiconductor layer 204. Here, "a voltage is applied" does not mean that the electrode voltage and the semiconductor layer voltage coincide with each other, and, for example, in the case where fourth semiconductor layer 204 is depleted, the voltage of second semiconductor layer 202 is a voltage obtained by subtracting the amount of voltage drop in fourth semiconductor layer 204.

As an example of second contact 402, wiring and a contact are formed using a material with high electrical conductivity so as to be in contact with second primary surface S2. In this case, it is preferable that the wiring be formed within dividing region 20 such that incident light entering APD 1 is not blocked. Moreover, as another example of second contact 402, third protection layer 501 to be described later may be formed using a material with high electrical conductivity and high light transmittance. Moreover, the second contact need not be provided outside of first semiconductor substrate, and first protection layer 211 and second protection layer 212 may be used as second contact 402. In this case, an extraction electrode for applying a voltage from the second power supply may be formed in a region in which photosensor 100 is not arranged, on the first primary surface S1 side of first semiconductor substrate 101 (for example, a region in which peripheral circuits to be described later, that is, vertical scanning circuit 61, horizontal scanning circuit 62, and readout circuit 63 are arranged), and a voltage may be applied to the second primary surface S2 side via first semiconductor substrate 101.

Third protection layer 501 and lens 502 are provided in optical layer 102. It is desirable that at least part of third protection layer 501 and lens 502 be formed from a material with high light transmittance. In order to enable reducing a dark current from second primary surface S2 of first semiconductor substrate 101, third protection layer 501 may be formed from a material having a work function different from that of first semiconductor substrate 101. Moreover, a back surface voltage may be applied to third protection layer 501, using a transparent electrode formed from indium tin oxide (ITO) or the like. Moreover, third protection layer 501 may include a plurality of layers. Moreover, an optical waveguide or the like may be formed in third protection layer 501. Moreover, a material with low light transmittance may be arranged in a grid-like pattern in dividing region 20 in optical layer 102. In this case, the material with low light transmittance can suppress oblique incident light from entering adjacent pixels. Consequently, color mixing between adjacent APDs 1 can be reduced.

Note that above-mentioned photosensor 100 receives light on the back surface, and has a configuration in which: optical layer 102 is provided on the second primary surface S2 side of first semiconductor substrate 101; and second primary surface S2 is on the side on which photosensor 100 receives light. However, photosensor 100 is not limited to the configuration, and may have a configuration in which: the optical layer is provided below wiring layer 103; and first primary surface S1 is on the side on which photosensor 100 receives light.

A portion on the first primary surface S1 side of third semiconductor layer 203 is at least partially depleted, and adjacent APDs 1 are electrically divided by a potential of this depletion layer. In other words, for two adjacent APDs 1, two depletion layers respectively extending from APDs 1 toward third semiconductor layer 203 are in contact with each other. Adjacent APDs 1 are electrically divided by the potential of this depletion layer. Because the portion on first primary surface S1 is depleted, it is desirable to reduce defects on the surface, and it is desirable not to form the trench and the contact. In this case, dividing region 20 between adjacent APD regions 10 can be decreased, and multiplying region 301 can be increased. Consequently, the aperture ratio of photosensor 100 can be made higher.

On the other hand, it is desirable to prevent depletion of first protection layer 211 and second protection layer 212. In general, there are many defects on a surface of a semiconductor substrate due to a dangling bond, metal contamination, and the like. Hence, the depletion is prevented by covering a surface of trench 207 and the second primary surface with first protection layer 211 and second protection layer 212, whereby the amount of occurrence of a dark current due to the defects can be reduced.

Moreover, it is desirable that trench 207, first protection layer 211, and second protection layer 212 be apart from the depletion layer extending from first semiconductor layer 201 toward second semiconductor layer 202 and fourth semiconductor layer 204. In other words, it is desirable that the depletion layer concerning multiplying region (avalanche region) 301 be apart from trench 207, first protection layer 211, and second protection layer 212. This is for the following reason: as described above, it is desirable to prevent depletion of first protection layer 211 and second protection layer 212; and hence, if the depletion layer extending from first semiconductor layer 201 toward second semiconductor layer 202 and fourth semiconductor layer 204 is in contact with first protection layer 211 and second protection layer 212, an electric field becomes strong in a region that is in contact with first protection layer 211 and second protection layer 212, whereby the electric field distribution becomes non-uniform. In the case where the impurity concentration of second semiconductor layer 202 is high, an upper end of the depletion layer substantially coincides with the junction boundary between first semiconductor layer 201 and second semiconductor layer 202, and hence it is desirable that lower ends of trench 207 and first protection layer 211 be closer to second primary surface S2 than the junction boundary between first semiconductor layer 201 and second semiconductor layer 202 be.

Moreover, APD 1 may have a so-called reach-through configuration, in which: second semiconductor layer 202 is completely depleted by the depletion layer due to the PN junction between first semiconductor layer 201 and second semiconductor layer 202; and the depletion layer is thus extended up to fourth semiconductor layer 204. According to this configuration, electric charge generated in first semiconductor substrate 101 can be drifted to multiplying region 301 by the electric field, and the light sensitivity can be improved.

Here, the impurity concentrations of the semiconductor layers and the protection layers are, for example, as follows:
first semiconductor layer 201: $10^{16}$ cm$^{-3}$ or more and $10^{19}$ cm$^{-3}$ or less;
second semiconductor layer 202: $10^{16}$ cm$^{-3}$ or more and $10^{18}$ cm$^{-3}$ or less;
third semiconductor layer 203: $10^{16}$ cm$^{-3}$ or more and $10^{18}$ cm$^{-3}$ or less;
fourth semiconductor layer 204: $10^{14}$ cm$^{-3}$ or more and $10^{17}$ cm$^{-3}$ or less;
first protection layer 211: $10^{18}$ cm$^{-3}$ or more and $10^{20}$ cm$^{-3}$ or less; and
second protection layer 212: $10^{18}$ cm$^{-3}$ or more and $10^{20}$ cm$^{-3}$ or less.

Moreover, the sizes of portions of dividing region 20 are, for example, as follows:
the width of trench 207: 0.1 µm or more and 1 µm or less;
the thickness of first protection layer 211: 0.1 µm or more and 1 µm or less; and
the width of third semiconductor layer 203: 0.1 µm or more and 2 µm or less.

In these cases, the magnitude of the electric field of multiplying region 301 is $2\times10^5$ V/cm or more and $6\times10^5$ V/cm or less, and the breakdown voltage thereof is 5 V or more and 200 V or less.

Moreover, in the present embodiment, the avalanche multiplication includes both linear multiplication and Geiger multiplication. The breakdown voltage is a voltage for switching between a linear multiplication mode and a Geiger multiplication mode. In the case where the voltage applied to APD 1 is the breakdown voltage or less, the linear multiplication mode is adopted. In the case where the voltage applied to APD 1 is the breakdown voltage or more, the Geiger multiplication mode is adopted. Particularly, in the case where the Geiger multiplication mode is adopted, a quenching element for stopping the Geiger multiplication may be provided. A resistor, a capacitor, a transistor, or the like can be used as the quenching element in this case. In the case of photosensor 100 illustrated in FIG. 2A, the quenching element may be provided via, for example, first contact 401. However, the linear multiplication mode in the present embodiment represents "an APD operation mode in which electric charge multiplication occurs due to impact ionization while the reverse bias applied to the APD is the breakdown voltage or less." Moreover, the Geiger multiplication mode represents "an APD operation mode in which the APD is operated by at least temporarily applying a reverse bias of the breakdown voltage or more to the APD," and this is the same meaning as that of a general term in this technical field.

Particularly, the configuration according to the present disclosure can be utilized for elements such as an image sensor, a multi-pixel photon counter (MPPC), or a single photon avalanche diode (SPAD).

Further, another example of photosensor 100 according to Embodiment 1 is described. FIG. 2B is a cross-sectional view illustrating another example of photosensor 100 according to Embodiment 1.

Figure 2B:
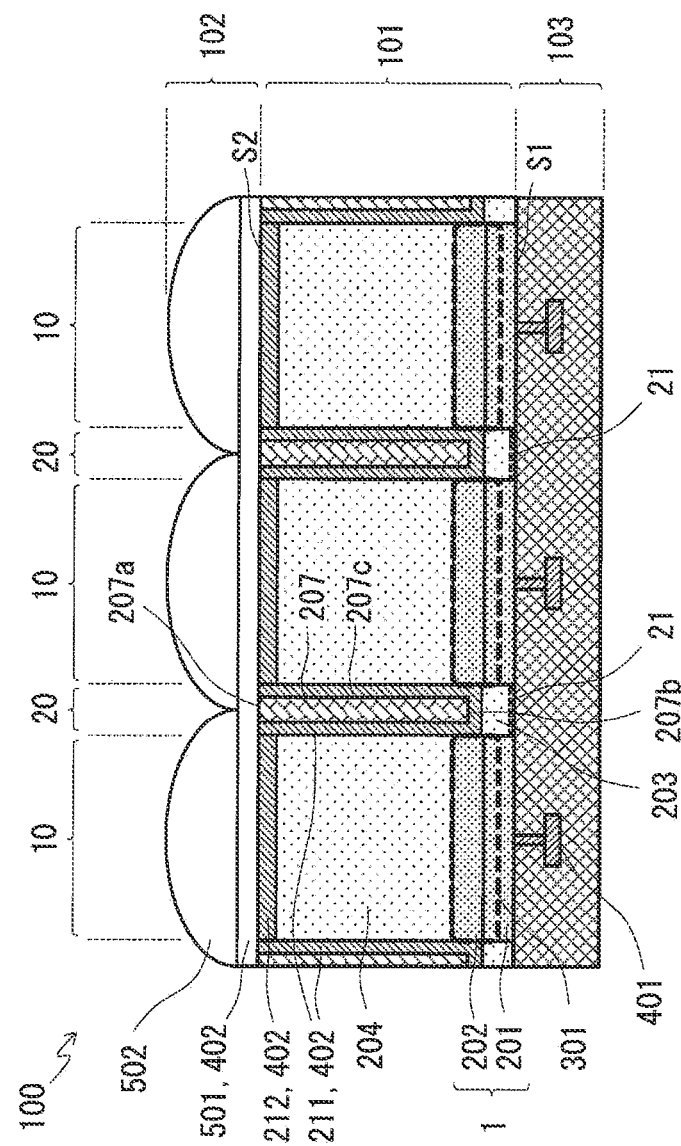
FIG. 2B is a cross-sectional view illustrating another example of the photosensor according to Embodiment 1.

Photosensor 100 illustrated in FIG. 2B similarly includes: the plurality of APD regions 10 formed in the matrix; and dividing region 20 that is formed between adjacent APD regions 10 among the plurality of APD regions 10. Dividing region 20 includes: third semiconductor layer 203 that is closer to the first primary surface S1 than second primary surface S2; and trench 207 that is closer to second primary surface S2 than third semiconductor layer 203 is.

Trench 207 includes first end 207a that is in contact with second primary surface S2 and second end 207b that is apart from first primary surface S1. Specifically, trench 207 is formed such that second end 207b of trench 207 is at the same level as the junction boundary between first semiconductor layer 201 and second semiconductor layer 202. First protection layer 211 is formed on side surface 207c and second end 207b of trench 207, but no electric field relaxing layer is formed on a side surface of first protection layer 211. Accordingly, also in the example illustrated in FIG. 2B, the aperture ratio of photosensor 100 can be made higher, and the light sensitivity can be improved.

Here, the impurity concentration of fourth semiconductor layer 204 may be gradually higher as closer to second primary surface S2 from first primary surface S1. In this case, due to an electric field that is generated by such a gradient of the impurity concentration, electric charge is drifted to multiplying region 301, whereby the light sensitivity can be improved and color mixing can be reduced. Here, "be gradually higher" includes the case where the rate of increase in the impurity concentration is constant and the case where the rate thereof is a step function.

1-2. Variation 1 of Embodiment 1

Next, photosensor 100A according to Variation 1 of Embodiment 1 is described with reference to FIG. 3.

Figure 3:
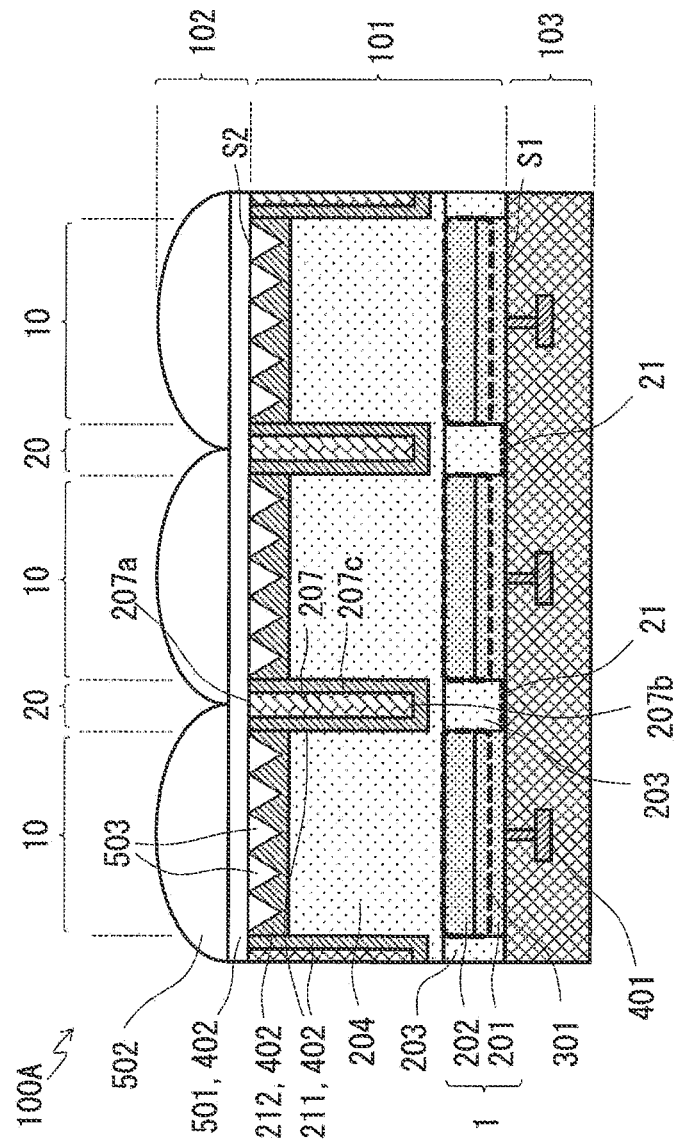
FIG. 3 is a cross-sectional view of a photosensor according to Variation 1 of Embodiment 1.

FIG. 3 is a cross-sectional view of photosensor 100A according to Variation 1 of Embodiment 1.

Photosensor 100A according to Variation 1 is different from photosensor 100 according to Embodiment 1 in that light scattering layer 503 is provided.

This light scattering layer 503 is provided on second primary surface S2 of first semiconductor substrate 101. Light scattering layer 503 may be provided in first semiconductor substrate 101, and may be provided in optical layer 102. In photosensor 100A according to Variation 1, a boundary between light scattering layer 503 and first semiconductor substrate 101 is inclined with respect to a light incidence direction. Hence, incident light that has entered second primary surface S2 substantially perpendicularly thereto is refracted at the boundary between light scattering layer 503 and first semiconductor substrate 101, and the incident light travels in first semiconductor substrate 101 in a direction inclined with respect to second primary surface S2 of first semiconductor substrate 101, whereby the optical path length is long. Consequently, the photoelectric conversion probability is enhanced, and the light sensitivity is improved.

Note that it is desirable that the material of light scattering layer 503 be the same as the material of third protection layer 501. If light scattering layer 503 and third protection layer 501 are formed from the same material, reflection at a boundary between light scattering layer 503 and third protection layer 501 can be reduced, and sensitivity improvement of photosensor 100A can be achieved. Moreover, it is desirable that second protection layer 212 be formed so as to be closer to first primary surface S1 than a lower end of light scattering layer 503 be. Consequently, a dark current that occurs due to crystal defects on a surface of light scattering layer 503 can be reduced.

1-3. Variation 2 of Embodiment 1

Photosensor 100B according to Variation 2 of Embodiment 1 is described with reference to FIG. 4 and FIG. 5.

Figure 4:
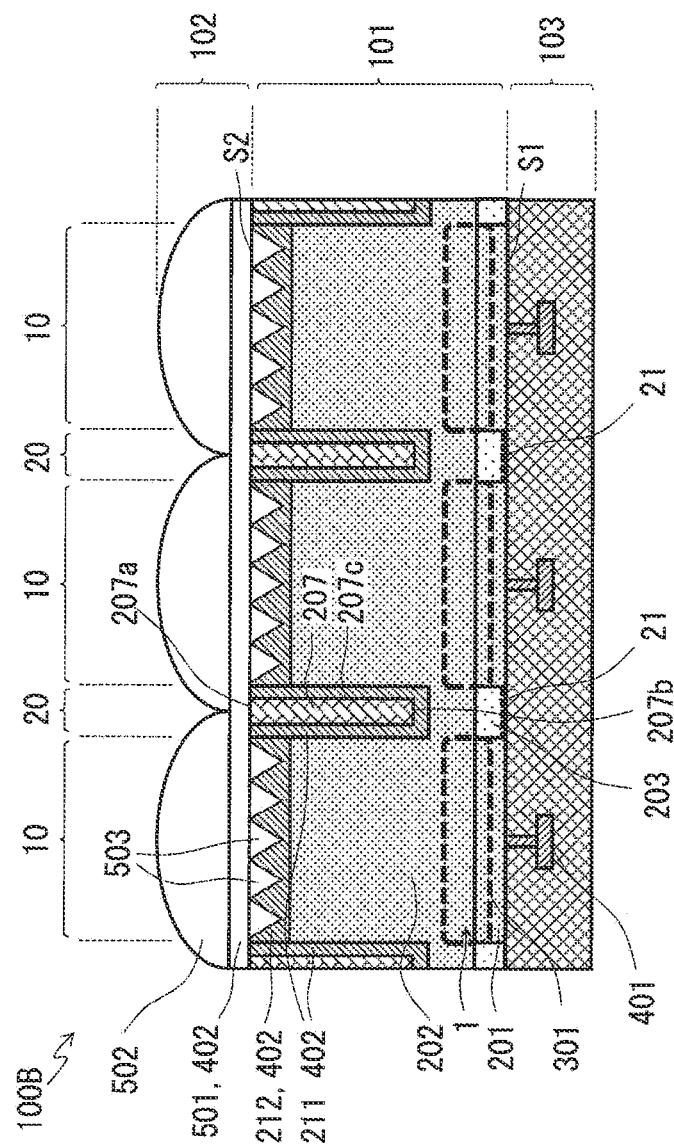
FIG. 4 is a cross-sectional view of a photosensor according to Variation 2 of Embodiment 1.

FIG. 4 is a cross-sectional view of photosensor 100B according to Variation 2 of Embodiment 1.

In photosensor 100 according to Embodiment 1, second semiconductor layer 202 is provided for each APD region 10 on a one-to-one basis. In contrast, in photosensor 100B according to Variation 2, second semiconductor layer 202 is shared by the plurality of APD regions 10. Specifically, second semiconductor layer 202 of photosensor 100B is continuous: from second semiconductor layer 202 located above first semiconductor layer 201; via second semiconductor layer 202 located below second protection layer 212; to second semiconductor layer 202 located above neighboring first semiconductor layer 201. Second semiconductor layer 202 is formed in a whole area of photosensor 100B in a plan view. In this case, fourth semiconductor layer 204 in Embodiment 1 need not be formed.

It is preferable that second semiconductor layer 202 have an impurity concentration that is higher at a position close to second primary surface S2 and lower at a position close to first primary surface S1. Specifically, it is preferable that the impurity concentration of second semiconductor layer 202 be gradually higher as closer to second primary surface S2 from first primary surface S1 in the depth direction. Consequently, electric charge generated in first semiconductor substrate 101 can be allowed to reach multiplying region 301 in a shorter time by not only thermal diffusion but also drifting due to a built-in potential gradient, and the light sensitivity of photosensor 100B can be improved. For example, the concentration on the first primary surface S1 side of second semiconductor layer 202 is $10^{16}$ or more and $10^{18}$ or less, and the concentration ratio thereof to the impurity concentration on the second primary surface S2 side of second semiconductor layer 202 is 1 time or more and 100 times or less.

Figure 5:
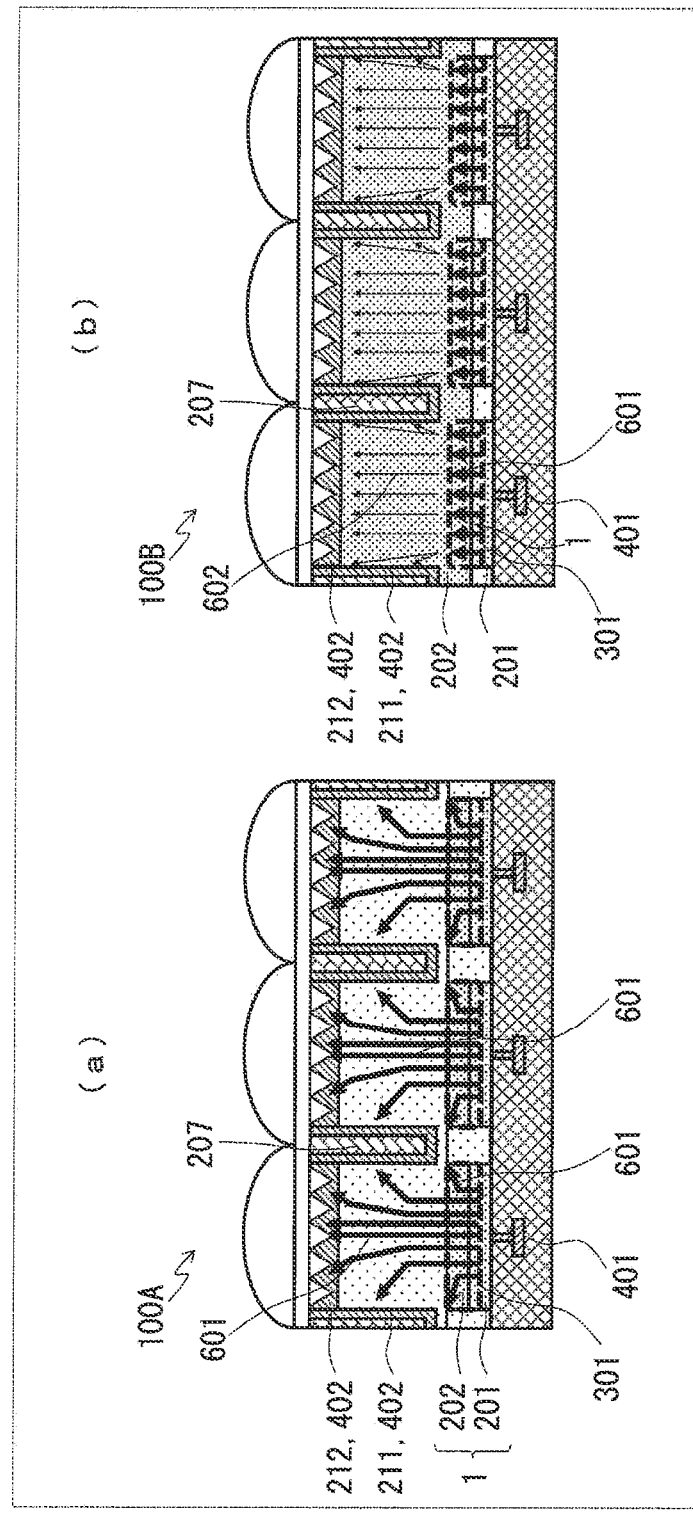
FIG. 5 is a schematic view illustrating electric field vectors that occur in the photosensor.

FIG. 5 is a schematic view illustrating electric field vectors that occur in the photosensor. (a) in FIG. 5 illustrates first electric field vectors 601 that occur in photosensor 100A in which reach-through type APDs 1 are used. First electric field vectors 601 are electric field vectors resulting from the PN junction between first semiconductor layer 201 and second semiconductor layer 202, and extend into fourth semiconductor layer 204. In the case where reach-through type APDs 1 are used, electric charge generated by photoelectric conversion is drifted to multiplying region 301 by first electric field vectors 601, and hence a line of electric force is extended to fourth semiconductor layer 204. As a result, in an end portion of APD 1, first electric field vectors 601 bend toward first protection layer 211, first electric field vectors 601 are thus short, and a strong electric field oblique to the semiconductor substrate occurs. On the other hand, in a central portion of APD 1, first electric field vectors 601 extend to second protection layer 212, first electric field vectors 601 are thus long, and a weak electric field occurs. Therefore, the direction and the magnitude of the electric field are different between an end portion and a central portion of multiplying region 301, and fluctuations in multiplication rate occur in multiplying region 301.

(b) in FIG. 5 illustrates first electric field vectors 601 and second electric field vectors 602 that occur in photosensor 100B according to Variation 2. Second electric field vectors 602 are electric field vectors resulting from a built-in potential. In the case of photosensor 100B according to Variation 2, electric charge generated by photoelectric conversion can be drifted to multiplying region 301 by second electric field vectors 602. Hence, it is sufficient to generate first electric field vectors 601 only in a narrow region around the boundary between first semiconductor layer 201 and second semiconductor layer 202, and first electric field vectors 601 can be prevented from coming into contact with first protection layer 211. Therefore, the electric field in multiplying region 301 is made uniform, and fluctuations in multiplication rate are less likely to occur in multiplying region 301. Consequently, an effective aperture ratio of photosensor 100B can be made higher. Note that, in the Geiger multiplication mode, this corresponds to enhancement of avalanche probability, and the light sensitivity can be improved.

Particularly, according to Variation 2, it is sufficient to form a depletion layer only in the vicinity of the boundary between first semiconductor layer 201 and second semiconductor layer 202, and hence the breakdown voltage is constant even when the thickness of the semiconductor substrate is increased. For example, in the case where the semiconductor substrate is formed from silicon, the coefficient of infrared light absorption is low. Hence, in order to improve the infrared light sensitivity, it is necessary to increase the thickness of the semiconductor substrate, but high-sensitivity APDs can be easily manufactured by adopting the configuration of Variation 2.

1-4. Variation 3 of Embodiment 1

Photosensor 100C according to Variation 3 of Embodiment 1 is described with reference to FIG. 6.

Figure 6:
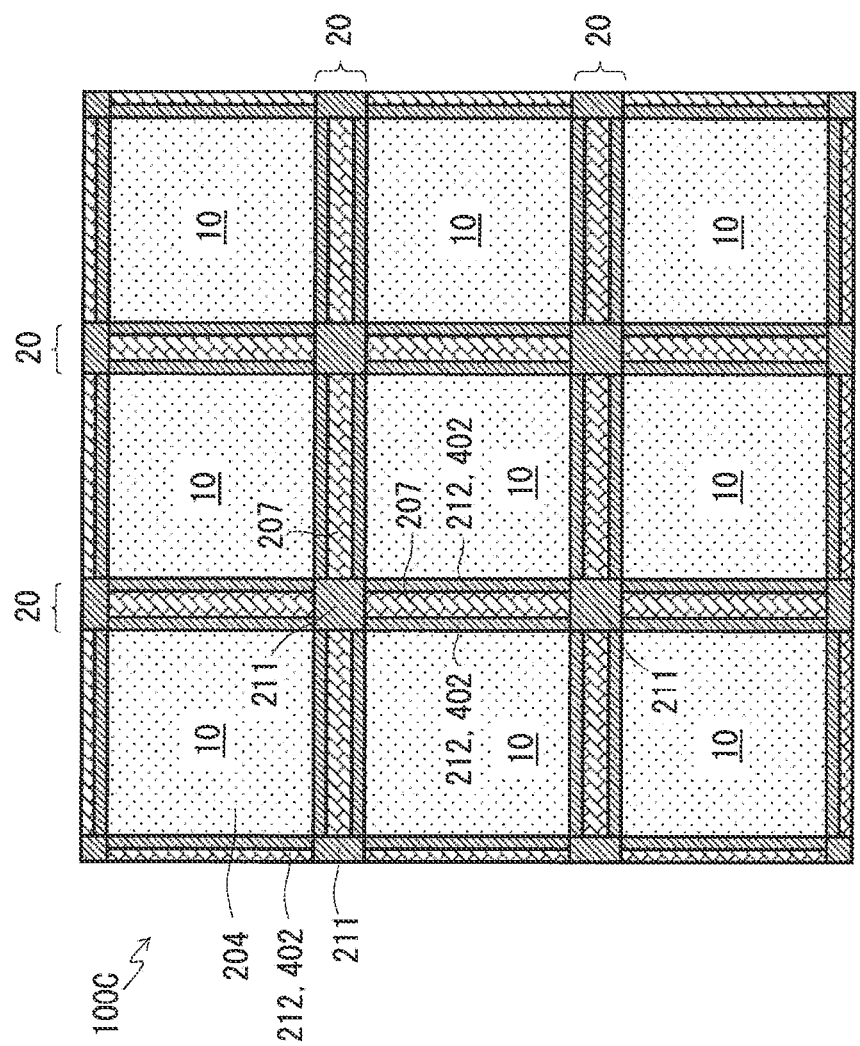
FIG. 6 is a plan view illustrating a layout configuration of a photosensor according to Variation 3 of Embodiment 1.

FIG. 6 is a plan view illustrating a layout configuration of photosensor 100C according to Variation 3 of Embodiment 1.

In photosensor 100C according to Variation 3, no trench 207 exists in regions in which longitudinally extending portions of dividing region 20 and laterally extending portions of dividing region 20 intersect with each other in the figure, and first protection layer 211 or second protection layer 212 is embedded in each of the regions instead of trench 207. According to this configuration, adjacent APD regions 10 are more easily electrically connected to each other by first protection layer 211 or second protection layer 212, and the voltage of second primary surface S2 of first semiconductor substrate 101 is more easily fixed. Consequently, fluctuations in sensitivity of photosensor 100C can be reduced.

Embodiment 2

2-1. Configuration of Photosensor

Next, photosensor 100D according to Embodiment 2 is described with reference to FIG. 7 to FIG. 12. In Embodiment 2, description is given of an example in which photosensor 100D includes pixel circuit 31.

Figure 7:
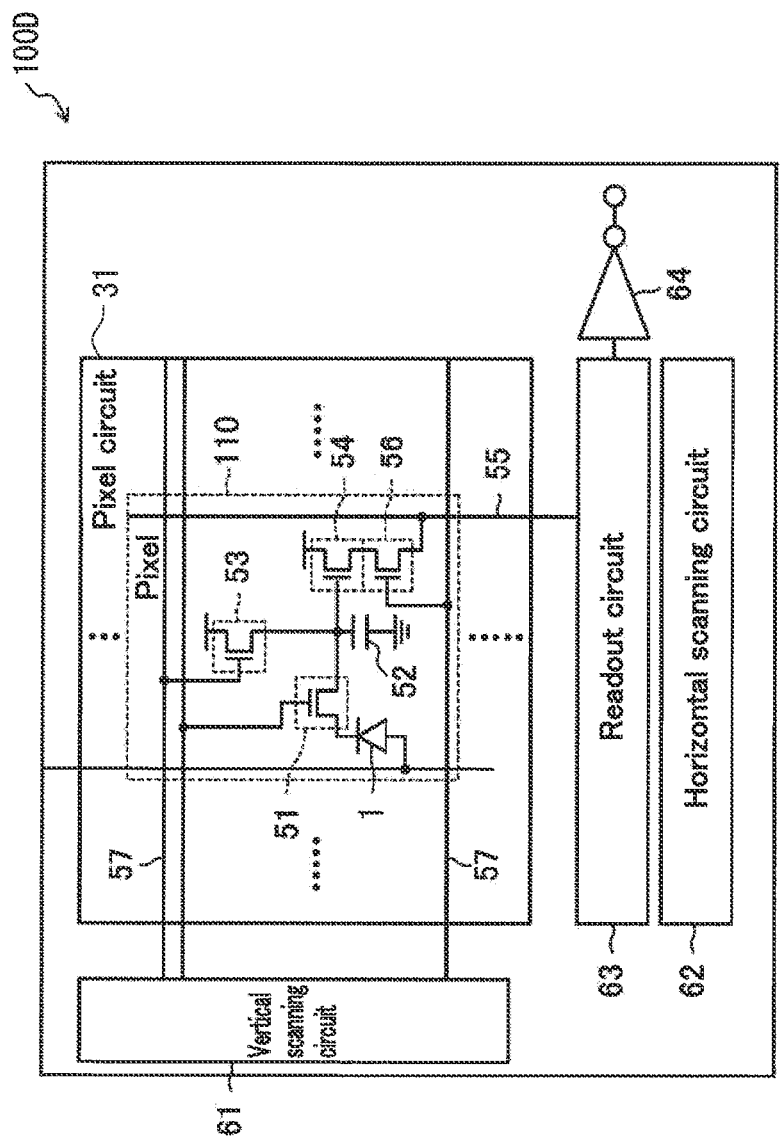
FIG. 7 is a block configuration diagram illustrating a pixel circuit of a photosensor according to Embodiment 2.

FIG. 7 is a block configuration diagram illustrating pixel circuit 31 of photosensor 100D according to Embodiment 2.

As illustrated in FIG. 7, photosensor 100D includes pixel 110, vertical scanning circuit 61, horizontal scanning circuit 62, readout circuit 63, and buffer amplifier 64.

Pixel 110 includes: APD 1; transfer transistor 51 that transfers electric charge accumulated in a cathode of APD 1; floating diffusion capacitor 52; reset transistor 53 that resets electric charge in floating diffusion capacitor 52; source follower transistor 54 that amplifies the electric charge accumulated in floating diffusion capacitor 52; vertical signal line 55; and selection transistor 56 that transfers a signal of a selected column to vertical signal line 55.

Transfer transistor 51 transfers electric charge outputted from APD 1, to floating diffusion capacitor 52, and floating diffusion capacitor 52 accumulates therein the electric charge. Reset transistor 53 resets a potential of floating diffusion capacitor 52 to a predetermined potential. A drain of reset transistor 53 is connected to the first power supply (not illustrated). A potential according to the amount of the electric charge accumulated in floating diffusion capacitor 52 is inputted to a gate of source follower transistor 54, and an amplified signal is outputted from a source of source follower transistor 54. A drain of source follower transistor 54 is connected to the first power supply or a power supply (not illustrated) different from the first power supply. Selection transistor 56 transfers the amplified signal outputted from the source of source follower transistor 54, to readout circuit 63 via vertical signal line 55.

Note that, in FIG. 7, each transistor is a metal oxide semiconductor field effect transistor (MOSFET), but may be a bipolar transistor, a junction field effect transistor (JFET), or the like, and the type of each transistor is not limited.

Figure 8:
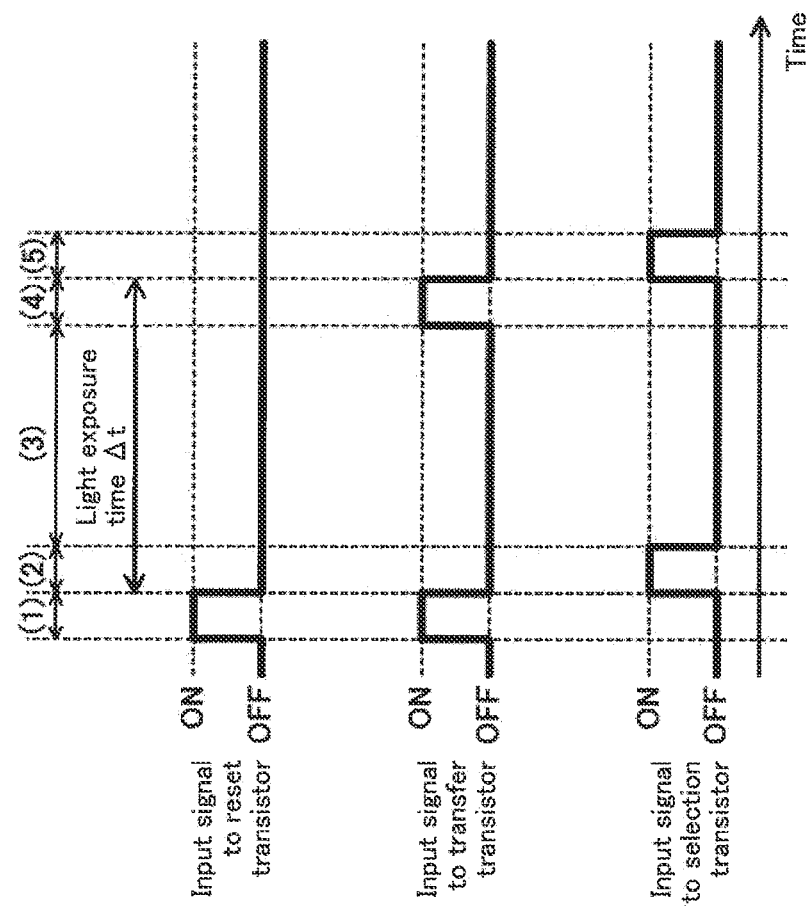
FIG. 8 is a timing chart illustrating an operation of the pixel circuit illustrated in FIG. 7.
Figure 9:
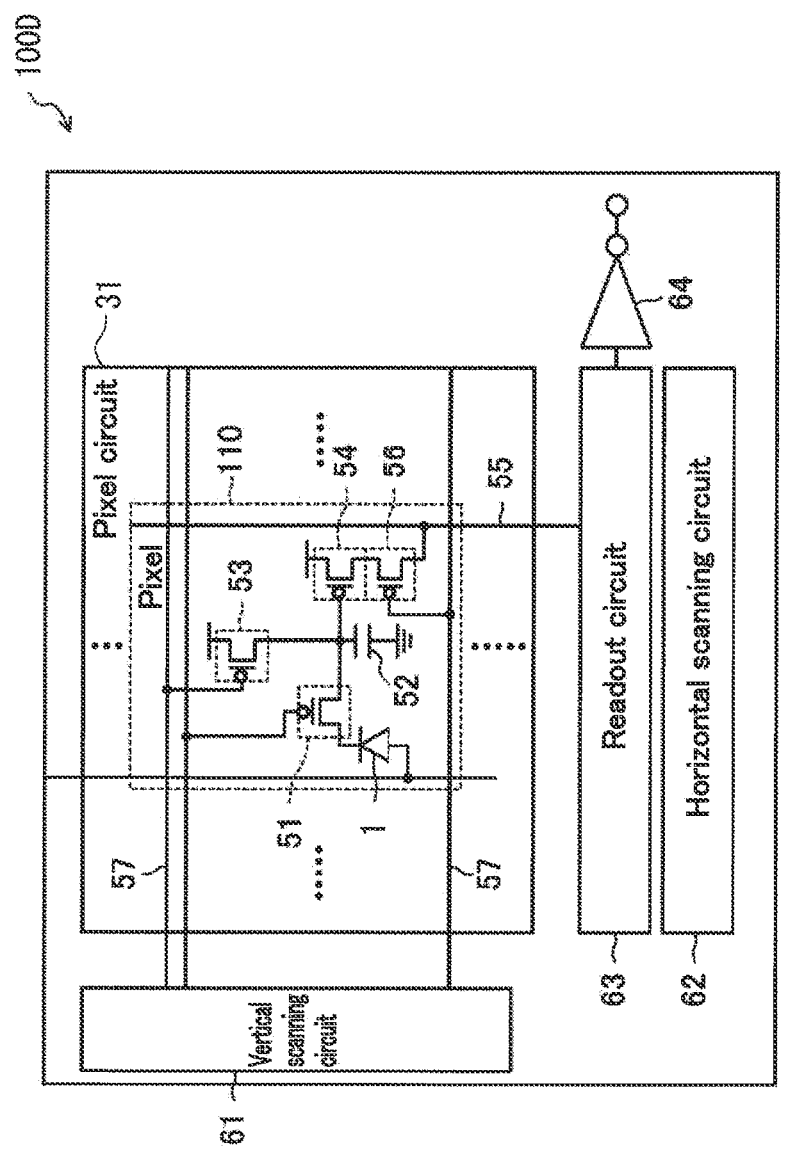
FIG. 9 is a block configuration diagram illustrating another example of the pixel circuit of the photosensor according to Embodiment 2.

FIG. 8 is a timing chart illustrating an operation of pixel circuit 31 illustrated in FIG. 7. In FIG. 8, an upper chart illustrates a signal inputted to a gate of reset transistor 53, a middle chart illustrates a signal inputted to a gate of transfer transistor 51, and a lower chart illustrates a signal inputted to a gate of selection transistor 56. In each chart, the upper stage means ON, and the lower stage means OFF. Each chart corresponds to a high voltage in the case of such an N-type transistor as illustrated in FIG. 7, and corresponds to a low voltage in the case of such a P-type transistor as illustrated in FIG. 9.

This timing chart is divided into the following five periods (1) to (5).

(1) Reset period: a signal (in FIG. 7, a high voltage) is inputted to the gate of reset transistor 53 from vertical scanning circuit 61 through horizontal signal line 57, and reset transistor 53 comes into an ON state, whereby floating diffusion capacitor 52 is reset. At the same time, a signal (in FIG. 7, a high voltage) is inputted to the gate of transfer transistor 51 from vertical scanning circuit 61 through horizontal signal line 57, whereby APD 1 is reset. Because the drain of reset transistor 53 is connected to the first power supply, if reset transistor 53 comes into the ON state, the potential of floating diffusion capacitor 52 is reset to a drain potential of reset transistor 53, that is, a potential of the first power supply. Moreover, because transfer transistor 51 connected to floating diffusion capacitor 52 is also in the ON state, a cathode potential of APD 1 is also reset to the drain potential of reset transistor 53, that is, the potential of the first power supply.

(2) Clamp period: reset transistor 53 and transfer transistor 51 are brought into an OFF state, a signal is inputted to the gate of selection transistor 56 from vertical scanning circuit 61 through horizontal signal line 57, and selection transistor 56 is brought into the ON state. A potential of a floating diffusion region immediately after the reset is transferred to readout circuit 63 via source follower transistor 54, selection transistor 56, and vertical signal line 55, and is stored as a first signal in a capacitor, a memory, or the like (not illustrated). The memory or the like may be provided in readout circuit 63.

(3) Light exposure period: after the reset period is ended, if incident light enters APD 1, electric charge generated by photoelectric conversion is avalanche-multiplied. The generated electric charge (in FIG. 7, electrons) is accumulated in capacitors connected to the cathode of APD 1, specifically, a PN junction capacitor between first semiconductor layer 201 and second semiconductor layer 202, a PN junction capacitor between first semiconductor layer 201 and third semiconductor layer 203, a parasitic capacitor of first contact 401, as well as wiring connected via first contact 401 and a parasitic capacitor of transfer transistor 51, and the like.

(4) Transfer period: after the light exposure period is ended, transfer transistor 51 is brought into the ON state again, and the electrons accumulated in APD 1 are transferred to floating diffusion capacitor 52. Light exposure time Δt corresponds to the sum of the clamp period, the light exposure period, and the transfer period, and pixel 110 outputs a signal in accordance with the amount of incident light that has entered during these periods.

(5) Read-out period: transfer transistor 51 is brought into the OFF state, selection transistor 56 is brought into the ON state, and the potential of the floating diffusion region in which the electrons are accumulated is transferred as a second signal to readout circuit 63 via source follower transistor 54, selection transistor 56, and vertical signal line 55. A difference between the second signal and the first signal acquired during the clamp period is obtained, whereby a signal is generated.

Note that the signal generated by readout circuit 63 is sent to buffer amplifier 64 by horizontal scanning circuit 62, and is further outputted to the outside. Moreover, because the difference between the first signal and the second signal is obtained (correlated double sampling), noise components such as kTC noise can be removed from the pixel signal, and hence a high-quality signal can be obtained. However, in the case of a Geiger mode operation and the like in which a high-power signal can be obtained, the clamp period may be omitted, only the first signal may be acquired, and a difference from a reference voltage may be obtained.

Note that pixel circuit 31 according to the present embodiment is not limited to the block configuration illustrated in FIG. 7, and, particularly, the circuit configuration used for the single photon avalanche diode (SPAD) can be combined with configurations according to all the embodiments.

FIG. 9 is a block configuration diagram illustrating another example of pixel circuit 31 of photosensor 100D according to Embodiment 2.

As illustrated in FIG. 9, the polarities of transfer transistor 51, reset transistor 53, source follower transistor 54, and selection transistor 56 may be the P-type, and the polarities of APD 1, transfer transistor 51, reset transistor 53, source follower transistor 54, and selection transistor 56 are not limited.

Next, a layout configuration and a cross-sectional structure of photosensor 100D according to Embodiment 2 are described with reference to FIG. 10 to FIG. 12.

Figure 10:
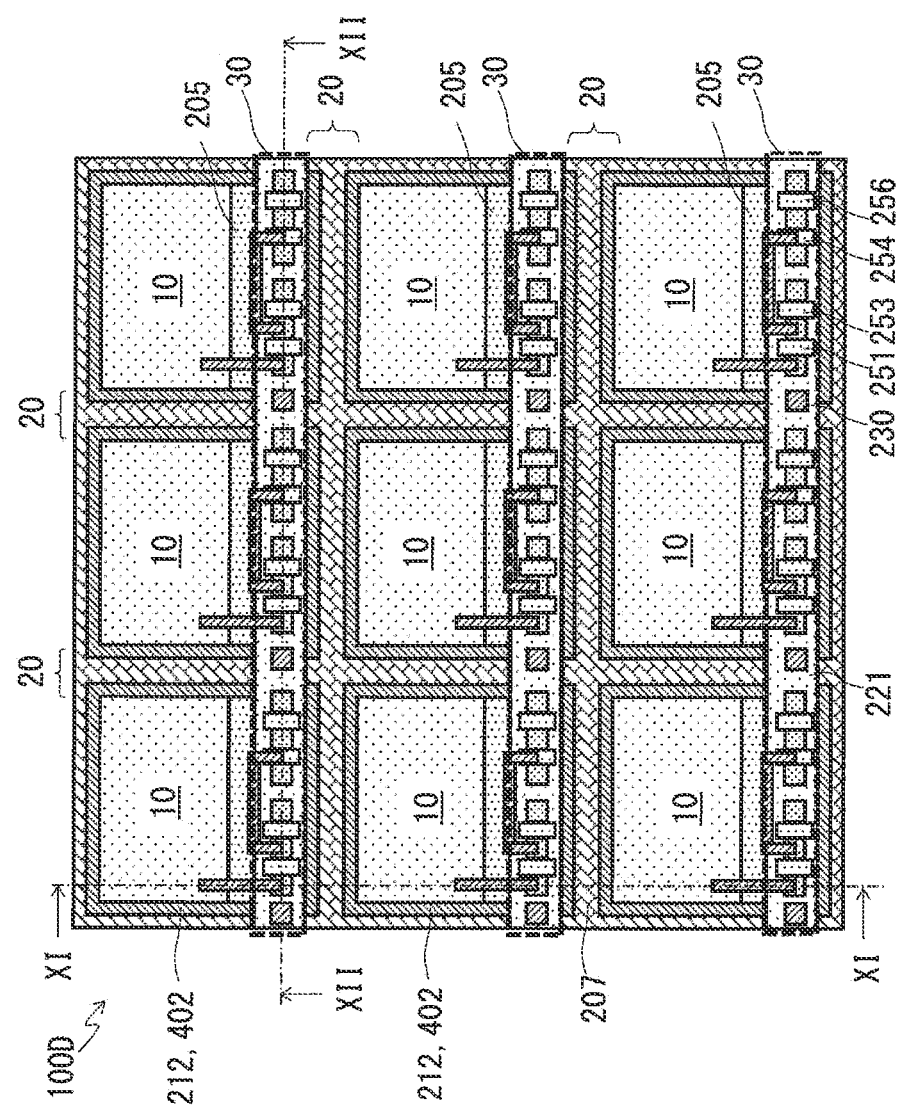
FIG. 10 is a plan view illustrating a layout configuration of the photosensor according to Embodiment 2.

FIG. 10 is a plan view illustrating a layout configuration of photosensor 100D. Note that, in the plan view of FIG. 10, for easy understanding of a positional relation of circuit region 30 to be described later, APD 1, and dividing region 20, circuit region 30 is illustrated on the front side. The same applies to the subsequent plan views.

FIG. 10 corresponds to the circuit diagram illustrated in FIG. 9, and FIG. 10 illustrates a configuration in which a P-type transistor is connected to the cathode of APD 1. However, the polarity of APD 1 may be opposite, that is, a configuration in which an N-type transistor is connected to an anode of APD 1 may be adopted. Here, similarly to FIG. 2A, the expressions of the first conductivity type and the second conductivity type are used.

Photosensor 100D according to Embodiment 2 further includes circuit region 30 in addition to the configuration of photosensor 100B according to Variation 2 of Embodiment 1. Circuit region 30 may partially overlap with APD regions 10 and dividing region 20.

As illustrated in FIG. 10, circuit region 30 includes first well 221, transfer transistor 251, reset transistor 253, source follower transistor 254, selection transistor 256, and well contact 230. Transfer transistor 251 is electrically connected to APD 1 via first contact 401.

Figure 11:
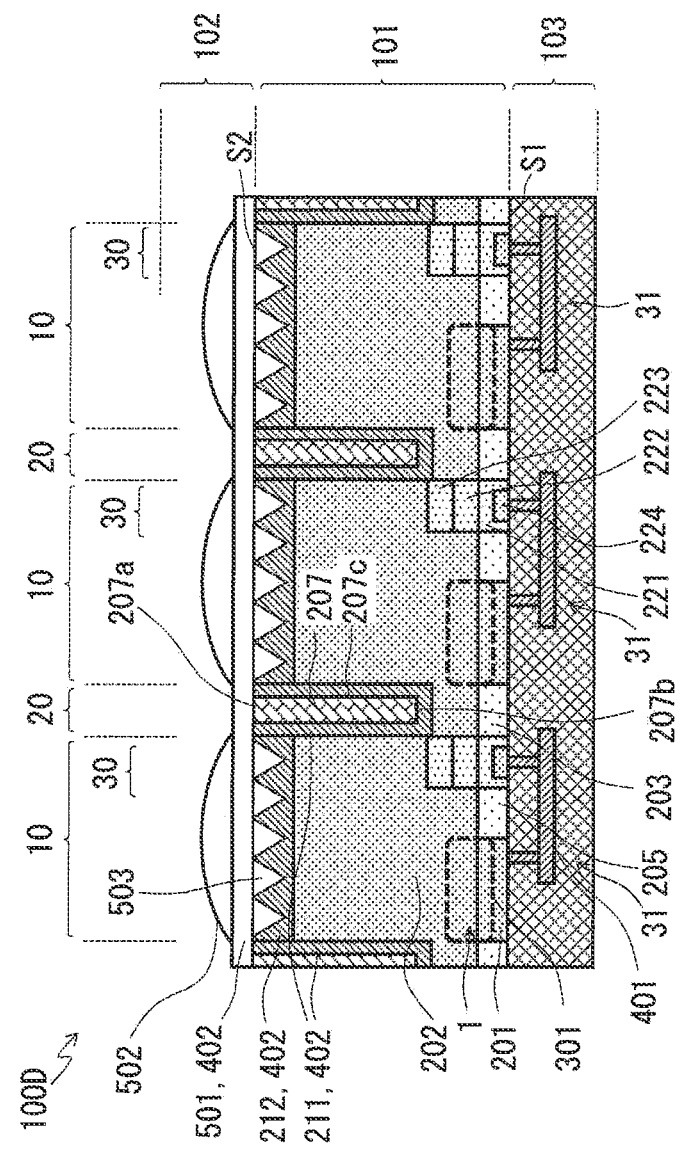
FIG. 11 is a cross-sectional view of the photosensor according to Embodiment 2, which is taken along an XI-XI line illustrated in FIG. 10.

FIG. 11 is a cross-sectional view of photosensor 100D, which is taken along an XI-XI line illustrated in FIG. 10. FIG. 12 is a cross-sectional view of photosensor 100D, which is taken along an XII-XII line illustrated in FIG. 10.

As illustrated in FIG. 11, photosensor 100D includes: first well 221 of the first conductivity type; second well 222 (whose conductivity type is not specified) that is formed on first well 221 and has an impurity concentration lower than that of first well 221; third well 223 that is of the second conductivity type and has an impurity concentration higher than that of second semiconductor layer 202; and transfer transistor 251 of the second conductivity type.

First semiconductor layer 201 and transfer transistor 251 are connected to each other by first contact 401. In each APD region 10, first semiconductor layer 201 and first well 221 are divided by fifth semiconductor layer 205, and fifth semiconductor layer 205 is at least partially depleted. Second well 222 having the low impurity concentration suppresses a high electric field from occurring between each of the above-mentioned wells and second semiconductor layer 202, and third well 223 suppresses electric charge generated by photoelectric conversion from entering first well 221. Consequently, the sensitivity of photosensor 100D can be improved.

Note that it is desirable that circuit region 30 (or first well 221) be shared by the plurality of APD regions 10 as illustrated in FIG. 10. Consequently, the area of circuit region 30 can be decreased, the area of multiplying region 301 can be increased, and the sensitivity of photosensor 100D can be improved. At this time, circuit region 30 overlaps with trench 207, first protection layer 211, and second protection layer 212.

Figure 12:
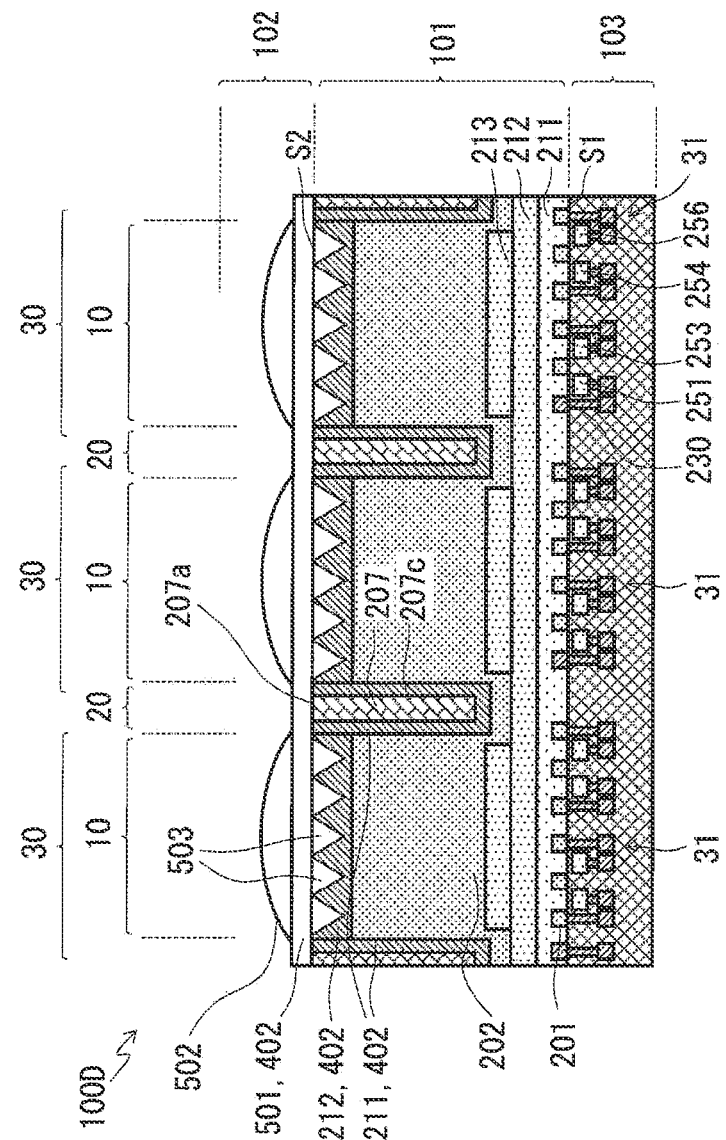
FIG. 12 is a cross-sectional view illustrating another example of the photosensor according to Embodiment 2.

Moreover, in photosensor 100D, as illustrated in FIG. 12, trench 207 and first protection layer 211 are arranged above the wells. Consequently, color mixing between adjacent APD regions 10 can be reduced. Moreover, third well 223 may be removed from the region in which trench 207 and first protection layer 211 are arranged. Consequently, an electric field of first well 221 can be more reduced.

2-2. Variation 1 of Embodiment 2

Next, photosensor 100E according to Variation 1 of Embodiment 2 is described with reference to FIG. 13 to FIG. 15.

Figure 13:
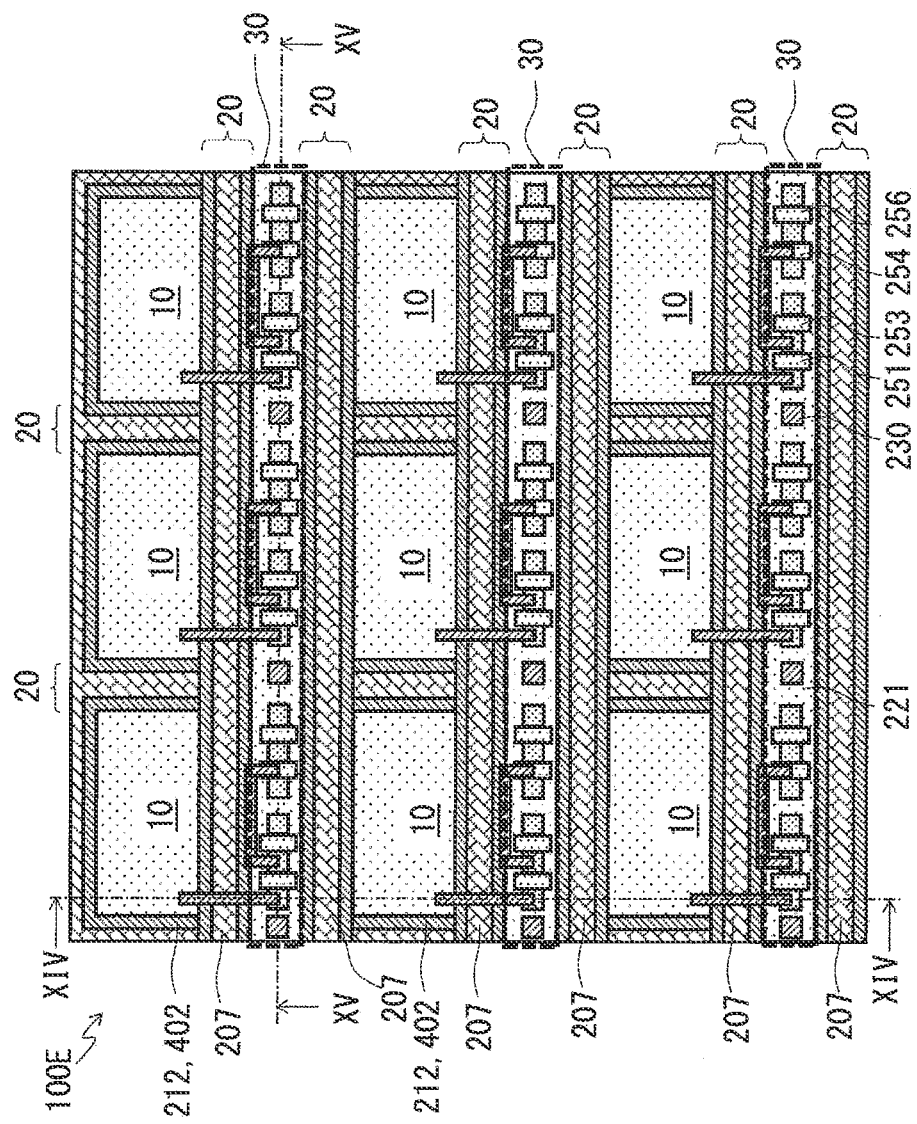
FIG. 13 is a plan view illustrating a layout configuration of a photosensor according to Variation 1 of Embodiment 2.

FIG. 13 is a plan view illustrating a layout configuration of photosensor 100E according to Variation 1 of Embodiment 2. FIG. 14 is a cross-sectional view of photosensor 100E, which is taken along an XIV-XIV line illustrated in FIG. 13. FIG. 15 is a cross-sectional view of photosensor 100E, which is taken along an XV-XV line illustrated in FIG. 13.

Figure 14:
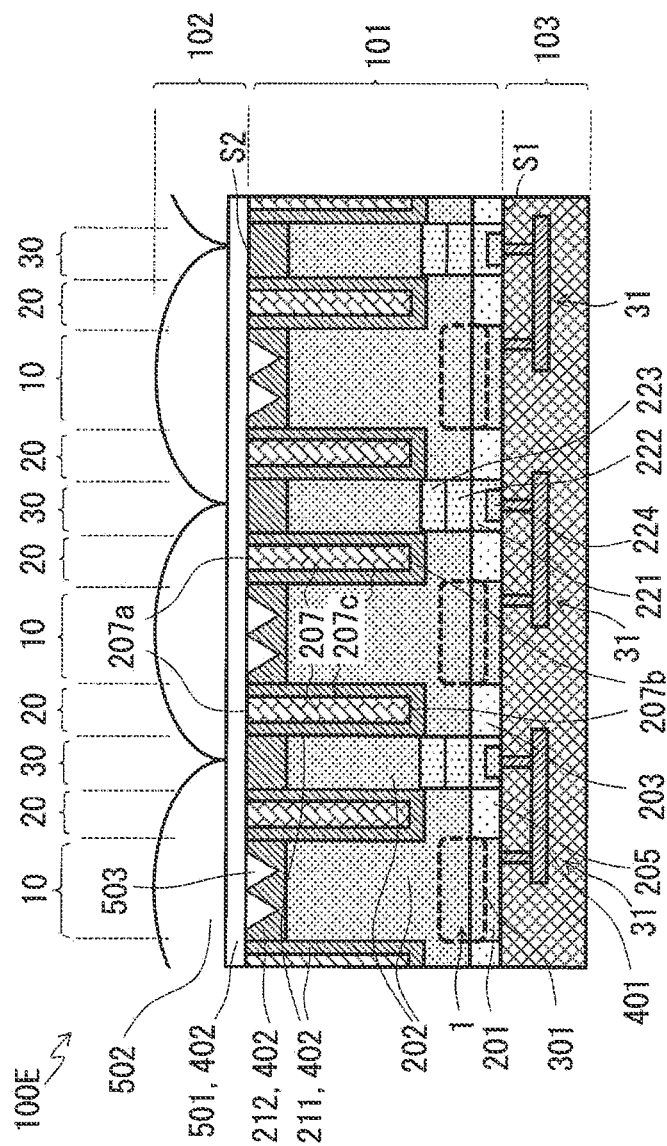
FIG. 14 is a cross-sectional view of the photosensor according to Variation 1 of Embodiment 2, which is taken along an XIV-XIV line illustrated in FIG. 13.
Figure 15:
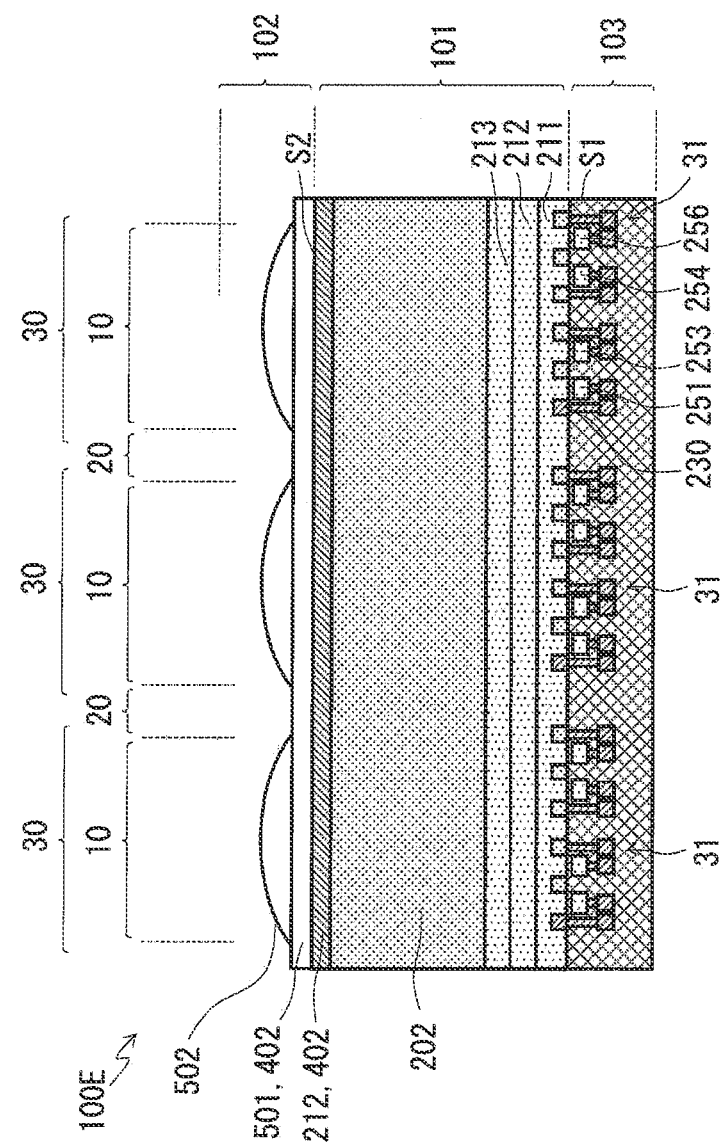
FIG. 15 is a cross-sectional view of the photosensor according to Variation 1 of Embodiment 2, which is taken along an XV-XV line illustrated in FIG. 13.

As illustrated in FIG. 14, in photosensor 100E, a plurality of dividing regions 20 are formed between adjacent APD regions 10 among the plurality of APD regions 10. Specifically, two dividing regions 20 are formed between adjacent APD regions 10. Circuit region 30 is formed between two dividing regions 20. Trench 207 and first protection layer 211 are arranged between multiplying region 301 and circuit region 30. In photosensor 100D, no trench 207 is formed between circuit region 30 and APD region 10, and hence electric charge generated by photoelectric conversion is discharged from first well 221 by thermal diffusion, whereby the light sensitivity may reduce. In contrast, in photosensor 100E, trench 207 is formed between circuit region 30 and APD region 10, and hence the electric charge generated by photoelectric conversion is less likely to be discharged from first well 221 by thermal diffusion, whereby the light sensitivity is improved.

Moreover, in photosensor 100E in FIG. 14, description is given of an example case where lens 502 and multiplying region 301 are arranged such that the optical center of lens 502 coincides with the center of multiplying region 301. Consequently, the light condensing efficiency can be increased, and the sensitivity of photosensor 100E can be improved. Moreover, in this photosensor 100E, although no trench 207 is provided above circuit region 30 as illustrated in FIG. 15, because APD region 10 is surrounded by trench 207, it is not necessary to provide trench 207 above circuit region 30.

2-3. Variation 2 of Embodiment 2

Next, photosensor 100F according to Variation 2 of Embodiment 2 is described with reference to FIG. 16.

Figure 16:
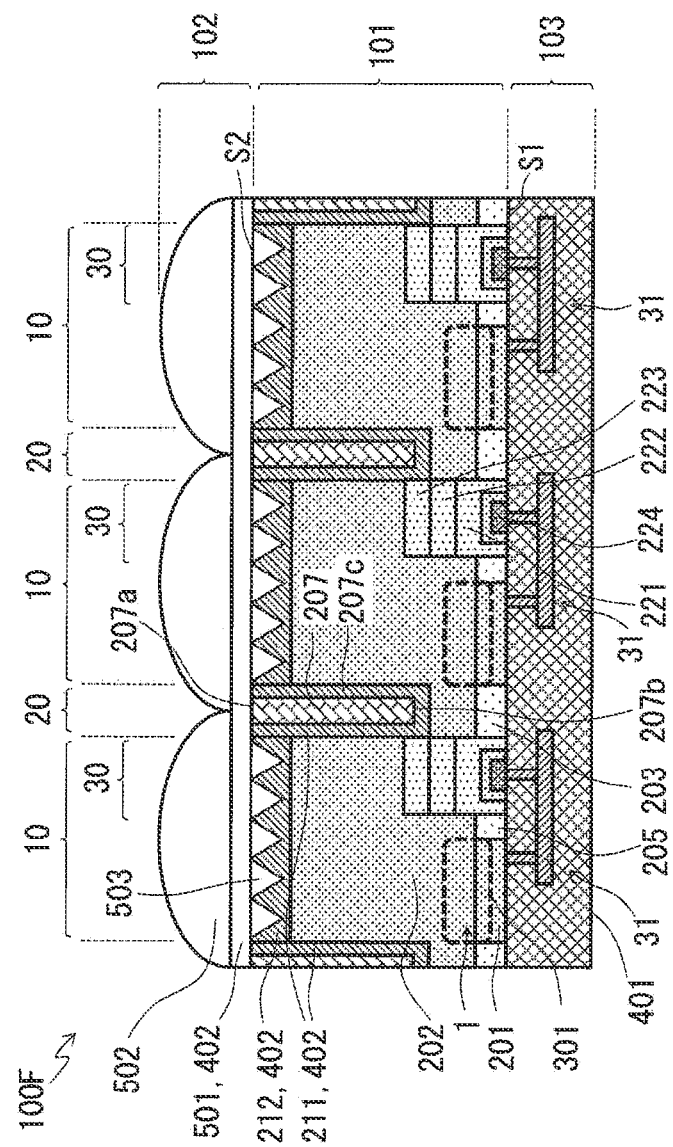
FIG. 16 is a cross-sectional view of a photosensor according to Variation 2 of Embodiment 2.

FIG. 16 is a cross-sectional view of photosensor 100F according to Variation 2 of Embodiment 2.

Photosensor 100F according to Variation 2 includes N-type transfer transistor 251, N-type reset transistor 253, N-type source follower transistor 254, N-type selection transistor 256, and fourth well 224 of the second conductivity type that is the P-type, fourth well 224 being surrounded by N-type first well 221. In this photosensor 100F, transfer transistor 251, reset transistor 253, source follower transistor 254, and selection transistor 256 are arranged in fourth well 224. For example, in the case of silicon, the electron mobility is higher than the hole mobility, and hence the amount of current is increased by adopting N-type transistors, whereby the time constant of pixel circuit 31 can be shortened.

2-4. Variation 3 of Embodiment 2

Next, photosensor 100G according to Variation 3 of Embodiment 2 is described with reference to FIG. 17 to FIG. 19.

Figure 17:
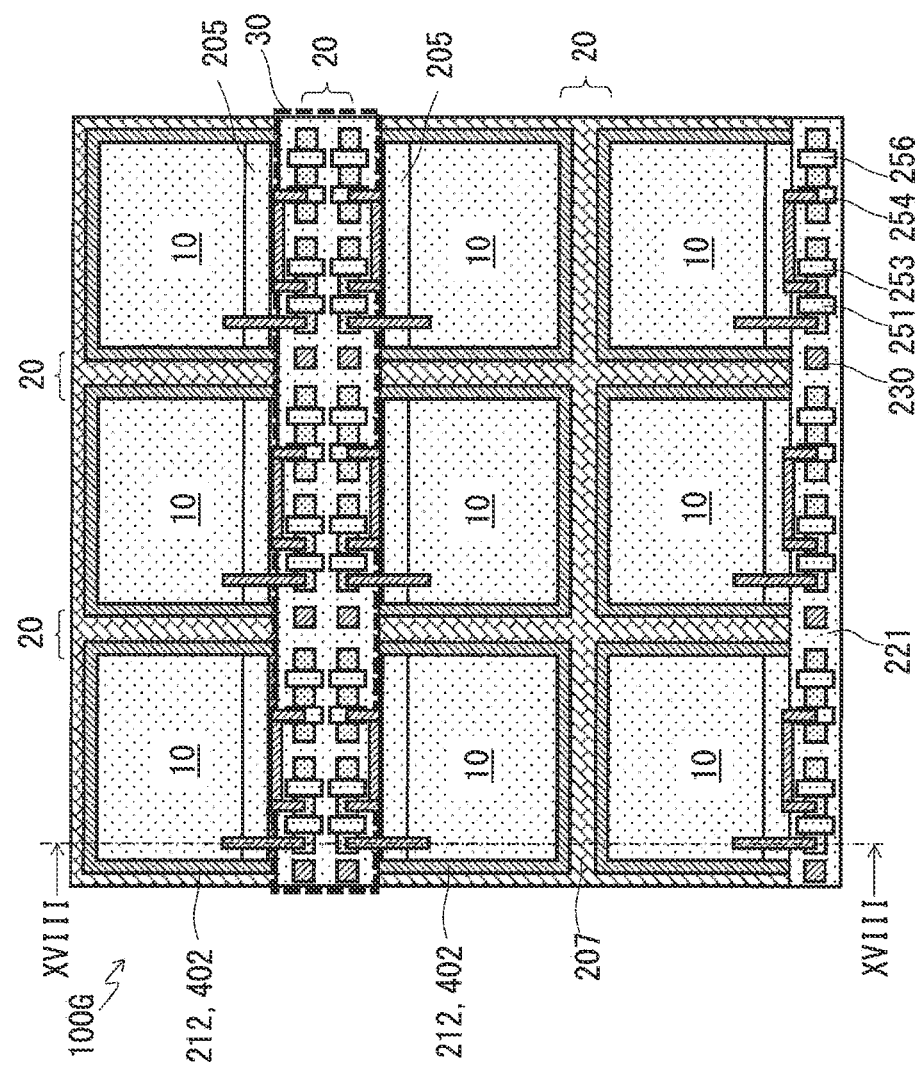
FIG. 17 is a plan view illustrating a layout configuration of a photosensor according to Variation 3 of Embodiment 2.

FIG. 17 is a plan view illustrating a layout configuration of photosensor 100G according to Variation 3 of Embodiment 2.

In the above-mentioned examples, pixels 110 in one row that are arranged in the lateral direction are provided in continuous circuit region 30, that is, share first well 221. In contrast, photosensor 100G according to Variation 3 has a layout configuration in which pixels 110 in two rows in the longitudinal direction in the figure share first well 221 in circuit region 30.

Figure 18:
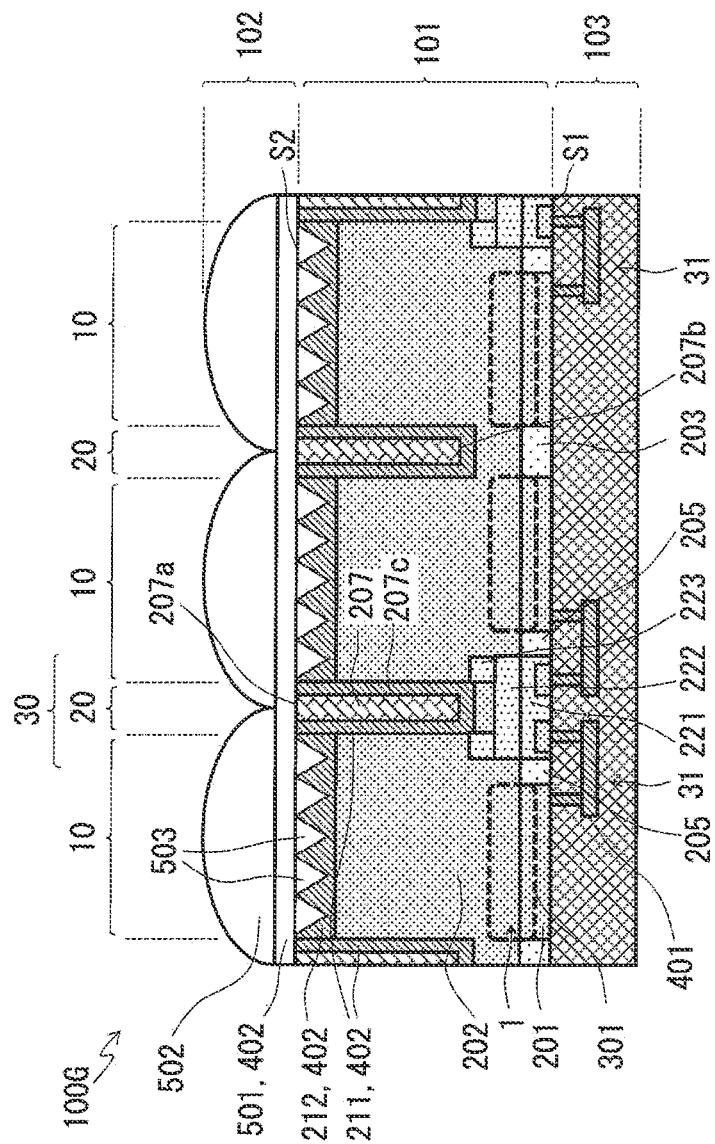
FIG. 18 is a cross-sectional view of the photosensor according to Variation 3 of Embodiment 2, which is taken along an XVIII-XVIII line illustrated in FIG. 17.

FIG. 18 is a cross-sectional view of photosensor 100G, which is taken along an XVIII-XVIII line illustrated in FIG. 17.

For example, in the case where circuit region 30 in one row is provided for pixels 110 in one row as illustrated in FIG. 10 described above, the number of necessary dividing regions 20 is two per pixel, that is, four per two pixels (in the longitudinal direction in the plan view). In contrast, in photosensor 100G according to Variation 3, circuit region 30 is shared as illustrated in FIG. 18, whereby the number of necessary dividing regions 20 is three per two pixels. Therefore, the number of dividing regions 20 can be reduced to three-quarters, the area of multiplying region 301 can be increased, and sensitivity improvement of photosensor 100G can be achieved.

Next, another example of photosensor 100G according to Variation 3 is described.

Figure 19:
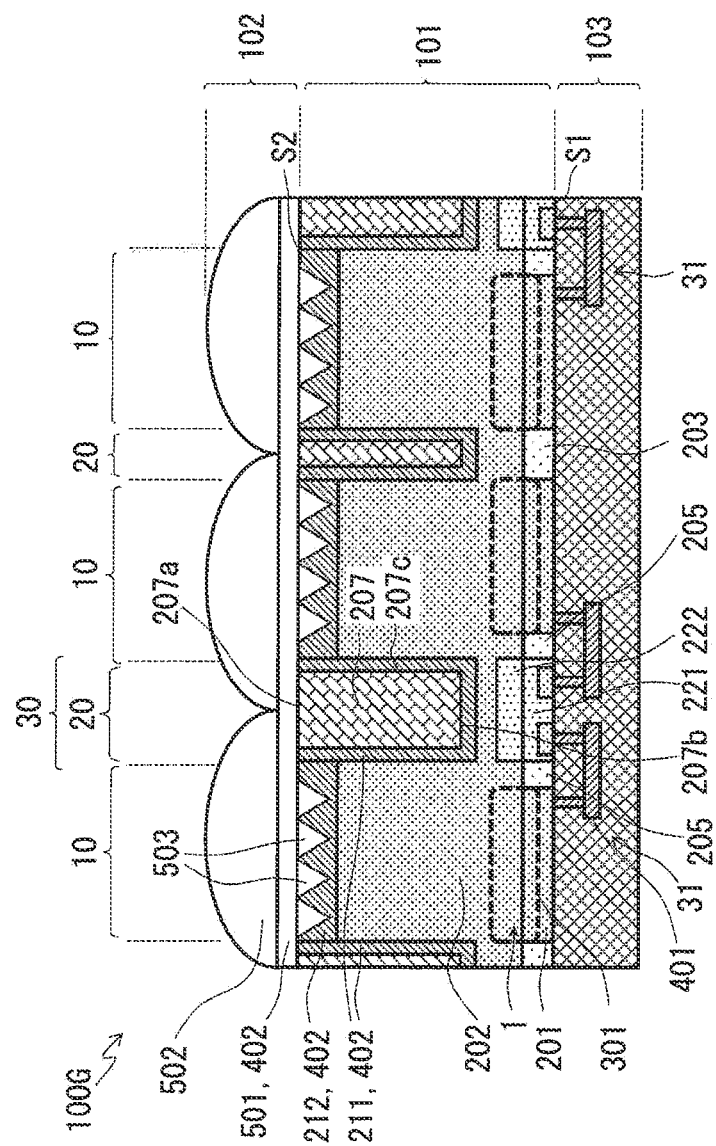
FIG. 19 is a cross-sectional view illustrating the photosensor according to Variation 3 of Embodiment 2.

FIG. 19 is a diagram illustrating another example of photosensor 100G according to Variation 3 of Embodiment 2.

In photosensor 100G according to another example of Variation 3, the width of trench 207 arranged in circuit region 30 is larger than the width of trench 207 illustrated in FIG. 18. Therefore, leakage of electric charge into first well 221 can be further suppressed, and further sensitivity improvement of photosensor 100G can be achieved. Note that photosensor 100G need not include third well 223.

Note that, in Embodiment 2 and Variations thereof, as described in Variation 2 of Embodiment 2, adopted is the configuration in which: second semiconductor layer 202 is formed in the whole area in a plan view; and the impurity concentration of second semiconductor layer 202 is gradually higher as closer to second primary surface S2 from first primary surface S1, but the present disclosure is not limited to this configuration. That is, as described with reference to FIGS. 2A and 2B in Embodiment 1, it is also possible to adopt the configuration in which: second semiconductor layer 202 is not formed in the whole area in a plan view; and the impurity concentration of fourth semiconductor layer 204 does not change from first primary surface S1 toward second primary surface S2.

Embodiment 3

Next, photosensor 100H according to Embodiment 3 is described with reference to FIG. 20 and FIG. 21.

Figure 20:
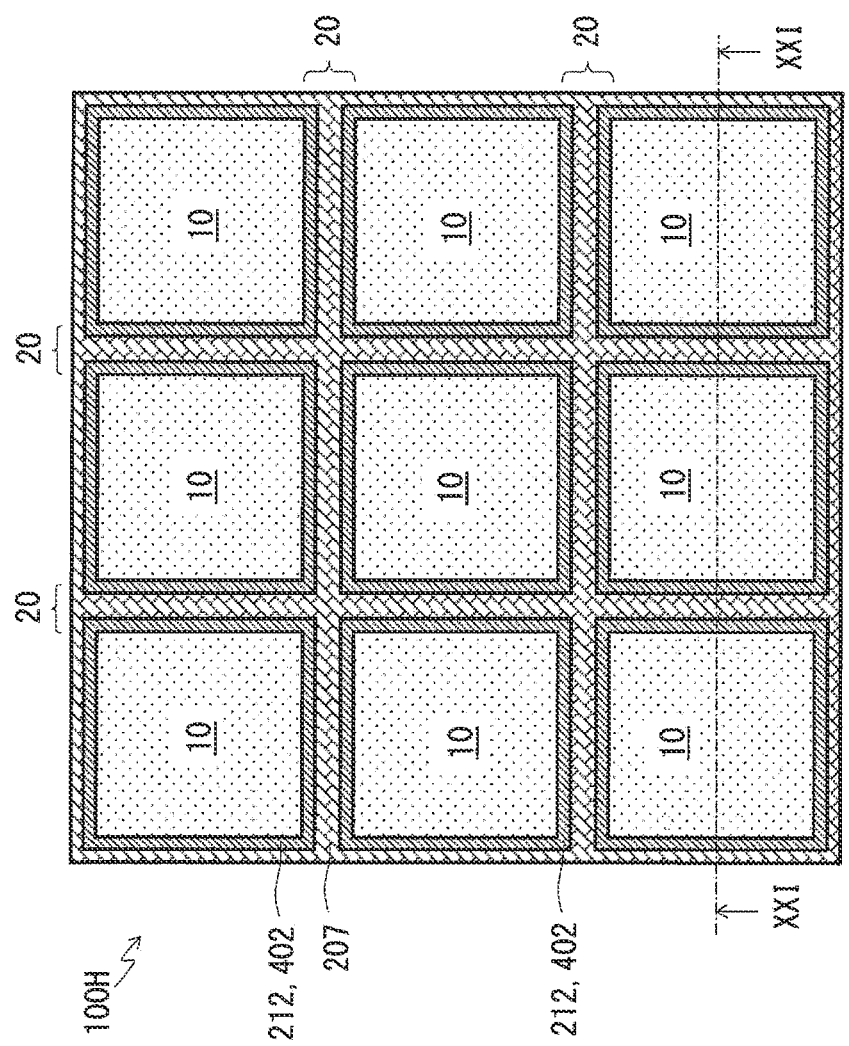
FIG. 20 is a plan view illustrating a layout configuration of a photosensor according to Embodiment 3.
Figure 21:
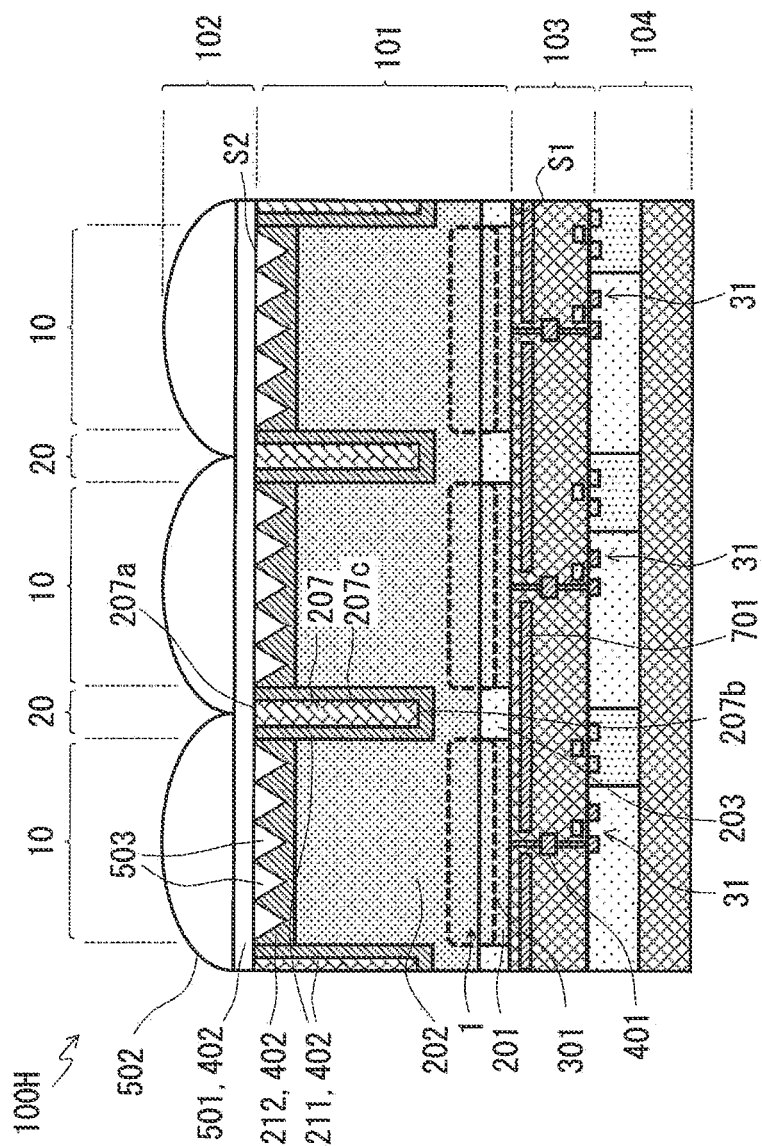
FIG. 21 is a cross-sectional view of the photosensor according to Embodiment 3, which is taken along an XXI-XXI line illustrated in FIG. 20.

FIG. 20 is a plan view illustrating a layout configuration of photosensor 100H according to Embodiment 3. FIG. 21 is a cross-sectional view of photosensor 100H, which is taken along an XXI-XXI line illustrated in FIG. 20.

First semiconductor substrate 101 of photosensor 100H has a configuration similar to that of first semiconductor substrate 101 of the photosensor according to Embodiment 1, but photosensor 100H according to Embodiment 3 further includes second semiconductor substrate 104, and pixel circuit 31 is formed in second semiconductor substrate 104.

In photosensor 100H, first semiconductor substrate 101 and second semiconductor substrate 104 are connected to each other via wiring layer 103, and various transistors are arranged in second semiconductor substrate 104. In this case, the conductivity type of second semiconductor substrate 104 and the conductivity types of wells and transistors formed in second semiconductor substrate 104 may be any of the first conductivity type and the second conductivity type, and may include both thereof. Consequently, the area of multiplying region 301 can be further increased, and the sensitivity can be further improved.

Moreover, it is also possible to adopt a configuration in which: reflection plate 701 is provided in wiring layer 103; incident light is reflected on this reflection plate 701; and the light sensitivity is thus further improved.

Embodiment 4

Next, distance measurement system according to Embodiment 4 is described. Distance measurement system according to Embodiment 4 is a so-called time-of-flight (TOF) distance measurement system.

Figure 22:
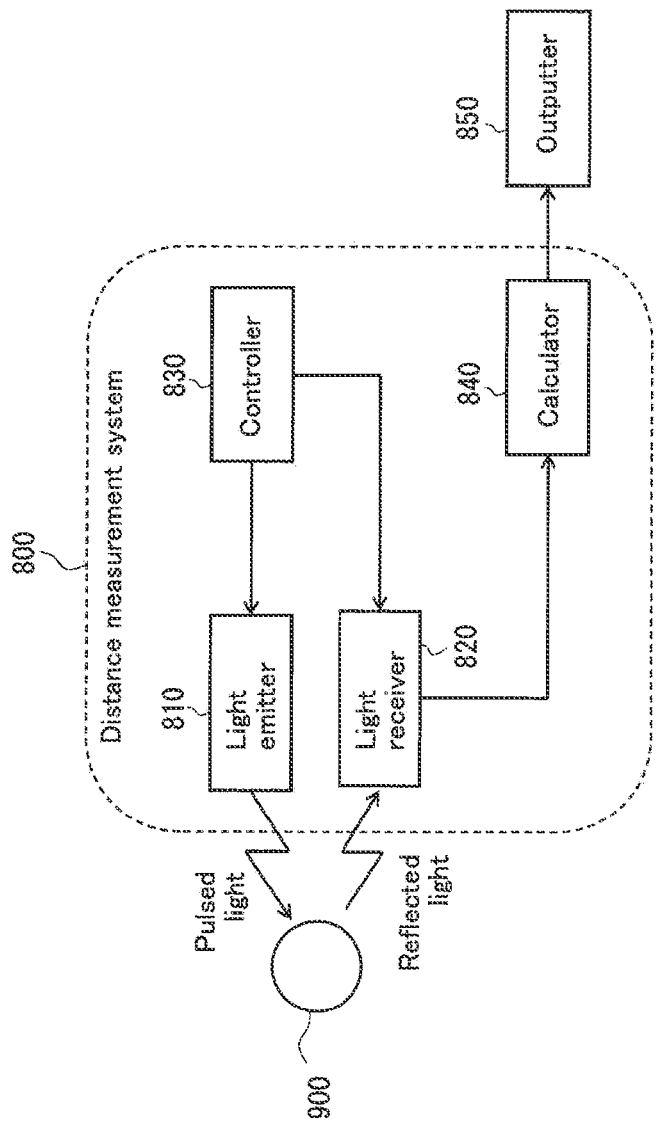
FIG. 22 is a block configuration diagram illustrating a distance measurement system including a photosensor.

FIG. 22 is a block configuration diagram illustrating distance measurement system 800 including a photosensor. The photosensor included in distance measurement system 800 may be any of above-mentioned photosensors 100 to 100H.

Distance measurement system 800 according to Embodiment 4 includes: light emitter 810 that emits pulsed light; light receiver 820 that receives the reflected pulsed light; controller 830 that controls light emitter 810 and light receiver 820; and calculator 840 that calculates a distance to object to be measured 900.

Light emitter 810 is configured by a light emitting device such as a light emitting diode, generates the pulsed light based on a control signal from controller 830, and emits the pulsed light toward object to be measured 900.

Light receiver 820 includes any of photosensors 100 to 100H, and receives the pulsed light reflected on object to be measured 900.

Controller 830 is configured by a central processing unit (CPU) and the like, and controls light emitter 810 and light receiver 820 such that the two constituent elements operate in synchronization with each other.

Based on an output signal from light receiver 820, calculator 840 measures the time from when the pulsed light is reflected on object to be measured 900 until when the pulsed light returns to light receiver 820, to thereby calculate the distance to object to be measured 900. Note that controller 830 and calculator 840 may be configured by one chip, and may be configured by different chips.

Outputter 850 outputs the distance to object to be measured 900 calculated by calculator 840, in a numerical data format or an image format. Outputter 850 is configured by a control device such as a CPU or a display device such as a display, for example, a liquid crystal display or an organic EL display. Moreover, outputter 850 may be incorporated in distance measurement system 800.

In each of the above-mentioned photosensors, for example, light exposure timing can be arbitrarily set using transfer transistor 51. Therefore, if any of above-mentioned photosensors 100 to 100H is used as the photosensor of distance measurement system 800, erroneous distance detection due to background light can be prevented, and a distance to an object can be obtained with high accuracy.

(Summary)

Photosensor 100 according to the present embodiment includes: a plurality of avalanche photo diode (APD) regions 10 of first semiconductor substrate 101, APD regions 10 each including APD 1; and dividing region 20 of first semiconductor substrate 101, the dividing region being located between adjacent APD regions 10 among APD regions 10. First semiconductor substrate 101 includes first primary surface S1 and second primary surface S2 which are opposite to each other. APD 1 in each of APD regions 10 includes: first semiconductor layer 201 of a first conductivity type that is in contact with first primary surface S1; and second semiconductor layer 202 of a second conductivity type opposite to the first conductivity type. Second semiconductor layer 202 is closer to second primary surface S2 than first semiconductor layer 201 is. Dividing region 20 includes: third semiconductor layer 203 of the first conductivity type or the second conductivity type that is closer to first primary surface S1 than second primary surface S2, and trench 207 that is closer to second primary surface S2 than third semiconductor layer 203 is. Trench 207 includes first end 207a that is in contact with second primary surface S2 and second end 207b that is apart from first primary surface S1. A part of trench 207 between second end 207b and first primary surface S1 is at least partially depleted.

According to this feature, because adjacent APD regions 10 can be divided by trench 207, color mixing between adjacent APDs 1 can be adequately suppressed. Moreover, because the structure in which second end 207b of trench 207 is apart from first primary surface S1 is adopted, for example, an electric field relaxing layer does not need to be provided on the side surface of trench 207, and the aperture ratio of photosensor 100 can be made higher. Consequently, both sensitivity improvement of photosensor 100 and prevention of color mixing can be achieved.

It should be noted that it is possible that second end 207b of trench 207 is at a level between (i) second primary surface S2 and (ii) a boundary between first semiconductor layer 201 and second semiconductor layer 202.

According to this feature, because adjacent APD regions 10 can be divided by trench 207, color mixing between adjacent APDs 1 can be adequately suppressed. Moreover, because second end 207b of trench 207 is at a level between: second primary surface S2; and the boundary between first semiconductor layer 201 and second semiconductor layer 202, for example, an electric field relaxing layer does not need to be provided on the side surface of trench 207, and the aperture ratio of photosensor 100 can be made higher. Consequently, both sensitivity improvement of photosensor 100 and prevention of color mixing can be achieved.

It should be noted that it is possible that photosensor 100 further includes a protection layer (for example, first protection layer 211 and second protection layer 212) covering second end 207b and side surface 207c of trench 207. The protection layer is closer to second primary surface S2 than second semiconductor layer 202 is.

For example, if the depletion layer around first semiconductor layer 201 and second semiconductor layer 202 is in contact with first protection layer 211, an electric field becomes strong in a region that is in contact with first protection layer 211, whereby the electric field distribution becomes non-uniform. In view of this, if first protection layer 211 is closer to second primary surface S than second semiconductor layer 202 is as described above, the electric field distribution can be suppressed from becoming non-uniform in multiplying region 301 that is formed in the vicinity of the boundary between first semiconductor layer 201 and second semiconductor layer 202. Consequently, the aperture ratio of photosensor 100 can be made higher, and sensitivity improvement of photosensor 100 can be achieved.

It should be noted that it is possible that second semiconductor layer 202 has an impurity concentration that is higher at a position close to second primary surface S2 than a position close to first primary surface S1.

According to this feature, because electric charge generated by photoelectric conversion can be drifted to multiplying region 301 by second electric field vectors 602, first electric field vectors 601 can be directly oriented to second protection layer 212. Therefore, the electric field in multiplying region 301 is made uniform, and fluctuations in multiplication rate are less likely to occur in multiplying region 301. Consequently, the aperture ratio of photosensor 100B can be made higher, and sensitivity improvement of photosensor 100B can be achieved.

It should be noted that it is possible that the impurity concentration of second semiconductor layer 202 is gradually higher as closer to second primary surface S2.

According to this feature, because electric charge generated by photoelectric conversion can be drifted to multiplying region 301 by second electric field vectors 602, first electric field vectors 601 can be directly oriented to second protection layer 212. Therefore, the electric field in multiplying region 301 is made uniform, and fluctuations in multiplication rate are less likely to occur in multiplying region 301. Consequently, the aperture ratio of photosensor 100B can be made higher, and sensitivity improvement of photosensor 100B can be achieved.

It should be noted that it is possible that second semiconductor layer 202 exists in a whole area of first semiconductor substrate 101 in a plan view.

According to this feature, because electric charge generated by photoelectric conversion can be more effectively drifted to multiplying region 301 by second electric field vectors 602, first electric field vectors 601 can be directly oriented to second protection layer 212. Therefore, the electric field in multiplying region 301 is made uniform, and fluctuations in multiplication rate are less likely to occur in multiplying region 301. Consequently, the aperture ratio of photosensor 100B can be made higher, and sensitivity improvement of photosensor 100B can be achieved.

It should be noted that it is possible that photosensor 100 further includes: first contact 401 connected to first semiconductor layer 201; and first contact 402 that applies a voltage to the protection layer (for example, first protection layer 211 and second protection layer 212). First contact 401, first contact 402, and trench 207 are apart from a dividing region area corresponding to dividing region 20 in first primary surface S1.

According to this feature, it is possible to adopt the structure in which first contact 401, second contact 402, and trench 207 are not provided in dividing region area 21, and the width of dividing region 20 can be made smaller. Consequently, the aperture ratio of photosensor 100 can be made higher, and sensitivity improvement of photosensor 100 can be achieved.

It should be noted that it is possible that two different depletion layers extending from two adjacent APDs each being APD 1 are in contact with at least part of third semiconductor layer 203.

Because a potential wall can be formed by these two different depletion layers, color mixing between adjacent APDs 1 can be suppressed, and the aperture ratio of photosensor 100 can be made higher. Consequently, sensitivity improvement of photosensor 100 can be achieved.

It should be noted that it is possible that photosensor 100 further includes pixel circuit 31 provided to first semiconductor substrate 101. Pixel circuit 31 is electrically connected to APD 1 via first contact 401.

According to this feature, photosensor 100D can be highly integrated, and the aperture ratio of photosensor 100D can be made higher.

It should be noted that it is possible that pixel circuit 31 includes a transistor of the second conductivity type and has an N-well+N– electric field relaxing region.

According to this feature, the time constant of pixel circuit 31 can be shortened.

It should be noted that it is possible that pixel circuit 31 includes a transistor of the first conductivity type and has a triple well structure.

According to this feature, the time constant of pixel circuit 31 can be shortened.

It should be noted that it is possible that each of dividing regions 20 is provided between a corresponding pair of adjacent APD regions 10, and that photosensor 100 includes circuit region 30 including pixel circuit 31. Circuit region 30 is located between dividing regions 20 of first semiconductor substrate 101.

According to this feature, circuit region 30 and the APD region can be reliably divided using dividing region 20. Therefore, for example, in APD region 10, lens 502 and multiplying region 301 can be arranged such that the optical center of lens 502 coincides with the center of multiplying region 301. Consequently, electric charge generated by photoelectric conversion can more easily enter multiplying region 301, and the sensitivity of photosensor 100E can be improved.

It should be noted that it is possible that photosensor 100H further includes second semiconductor substrate 104 that is a semiconductor substrate different from first semiconductor substrate 401. Second semiconductor substrate 194 includes pixel circuit 31 electrically connected to APD 1 via first contact 401.

According to this feature, photosensor 100H can be highly integrated, and the aperture ratio of photosensor 100H can be made higher.

It should be noted that it is possible that second primary surface S2 is on a side on which photosensor 100 receives light.

According to this feature, pixel circuit 31 can be easily provided to first semiconductor substrate 101, and the aperture ratio of photosensor 100 can be made higher.

It should be noted that it is possible that photosensor 100 receives light on a back surface.

According to this feature, pixel circuit 31 can be easily provided to first semiconductor substrate 101, and the aperture ratio of photosensor 100 can be made higher.

Distance measurement system 800 according to the present embodiment includes: light receiver 820 including the above-described photosensor; light emitter 810 that emits light towards object 900 to be measured; controller 830 that controls light receiver 820 and light emitter 810; and calculator 840 that receives, from light receiver 820, a signal corresponding to the light reflected on object 900, and calculates a distance to object 900 based on the signal.

Because distance measurement system 800 includes any of the above-mentioned photosensors having improved sensitivity, erroneous distance detection can be prevented, and the distance to object to be measured 900 can be obtained with high accuracy.

OTHER EMBODIMENTS

In addition, the present disclosure may include embodiments obtained by making various modifications on the above embodiments which those skilled in the art will arrive at, or embodiments obtained by selectively combining the elements and functions disclosed in the above embodiments, without materially departing from the scope of the present disclosure.

INDUSTRIAL APPLICABILITY

The present disclosure is useful as a photosensor, an image sensor, or a distance measurement system including an avalanche photo diode.

The invention claimed is:
1. A photosensor comprising:
a plurality of avalanche photo diode (APD) regions of a first semiconductor substrate, the plurality of APD regions each including an APD; and
a dividing region of the first semiconductor substrate, the dividing region being located between adjacent APD regions among the plurality of APD regions, wherein;
the first semiconductor substrate includes a first primary surface and a second primary surface which are opposite to each other,
the APD in each of the plurality of APD regions includes:
a first semiconductor layer of a first conductivity type that is in contact with the first primary surface; and
a second semiconductor layer of a second conductivity type opposite to the first conductivity type, the second semiconductor layer being closer to the second primary surface than the first semiconductor layer is,
the dividing region includes:
a third semiconductor layer made of a semiconductor layer of only the first conductivity type or a semiconductor layer of only the second conductivity type, the third semiconductor layer being closer to the first primary surface than the second primary surface, and
a trench that is closer to the second primary surface than the third semiconductor layer is,
the trench includes a first end that is in contact with the second primary surface and a second end that is apart from the first primary surface,
the third semiconductor layer extends from the second end to the first primary surface, and
a part of the third semiconductor layer between the second end and the first primary surface is at least partially depleted.

2. The photosensor according to claim 1,
wherein the second end of the trench is at a level between (i) the second primary surface and (ii) a boundary between the first semiconductor layer and the second semiconductor layer.

3. The photosensor according to claim 2, further comprising
a protection layer covering the second end and a side surface of the trench, wherein
the protection layer is closer to the second primary surface than the second semiconductor layer is.

4. The photosensor according to claim 1, wherein
the second semiconductor layer has an impurity concentration that is higher at a position close to the second primary surface than a position close to the first primary surface.

5. The photosensor according to claim 4, wherein
the impurity concentration of the second semiconductor layer is gradually higher as closer to the second primary surface.

6. The photosensor according to claim 5, wherein
the second semiconductor layer exists in a whole area of the first semiconductor substrate in a plan view.

7. The photosensor according to claim 3, further comprising:
a first contact connected to the first semiconductor layer; and
a second contact connected to the second primary surface, wherein
the first contact, the second contact, and the trench are apart from a dividing region area corresponding to the dividing region in the first primary surface.

8. The photosensor according to claim 7, wherein
two different depletion layers extending from two adjacent APDs each being the APD are in contact with at least part of the third semiconductor layer.

9. The photosensor according to claim 7, further comprising
a pixel circuit provided to the first semiconductor substrate, wherein
the pixel circuit is electrically connected to the APD via the first contact.

10. The photosensor according to claim 9, wherein
the pixel circuit includes an N-type transfer transistor, an N-type reset transistor, an N-type follower transistor, an N-type select transistor, and a P-well surrounded by an N-well.

11. The photosensor according to claim 9, wherein
the pixel circuit includes a transistor of the first conductivity type and has a triple well structure.

12. The photosensor according to claim 9, wherein:
each of a plurality of dividing regions each being the dividing region is provided between a corresponding pair of adjacent APD regions among the plurality of APD regions,
the photosensor comprises a circuit region including the pixel circuit, and
the circuit region is located between dividing regions each being the dividing region of the first semiconductor substrate.

13. The photosensor according to claim 7, further comprising
a second semiconductor substrate that is a semiconductor substrate different from the first semiconductor substrate, wherein
the second semiconductor substrate includes a pixel circuit electrically connected to the APD via the first contact.

14. The photosensor according to claim 1, wherein
the second primary surface is on a side on which the photosensor receives light.

15. The photosensor according to claim 1, wherein
the photosensor receives light on a back surface.

16. A distance measurement system comprising:
a light receiver including the photosensor according to claim 1;
a light emitter that emits light towards an object to be measured;
a controller that controls the light receiver and the light emitter; and
a calculator that receives, from the light receiver, a signal corresponding to the light reflected on the object, and calculates a distance to the object based on the signal.

17. The photosensor according to claim 1, wherein:
the APD in each of the plurality of APD regions further includes:
a fourth semiconductor layer of the second conductivity type disposed, the fourth semiconductor layer being closer to the second primary surface than the second semiconductor layer is, and
an impurity concentration of the fourth semiconductor layer is lower than an impurity concentration of the second semiconductor layer.

* * * * *